(12) United States Patent
Rezgui

(10) Patent No.: US 10,041,992 B2
(45) Date of Patent: Aug. 7, 2018

(54) REMOTE SENSING AND PROBING OF HIGH-SPEED ELECTRONIC DEVICES

(71) Applicant: AZ, LLC, San Francisco, CA (US)

(72) Inventor: Sana Rezgui, San Francisco, CA (US)

(73) Assignee: AZ, LLC, San Francisco, CA (US)

(*) Notice: Subject to any disclaimer, the term of this patent is extended or adjusted under 35 U.S.C. 154(b) by 0 days.

(21) Appl. No.: 15/459,983

(22) Filed: Mar. 15, 2017

(65) Prior Publication Data

US 2017/0269147 A1    Sep. 21, 2017

Related U.S. Application Data

(60) Provisional application No. 62/310,408, filed on Mar. 18, 2016.

(51) Int. Cl.

| | |
|---|---|
| *G01R 31/28* | (2006.01) |
| *G01R 15/00* | (2006.01) |
| *G10L 19/02* | (2013.01) |
| *G01R 31/3181* | (2006.01) |
| *G01R 31/319* | (2006.01) |

(52) U.S. Cl.
CPC .......... *G01R 31/2834* (2013.01); *G01R 15/00* (2013.01); *G01R 31/31813* (2013.01); *G01R 31/31907* (2013.01); *G10L 19/02* (2013.01)

(58) Field of Classification Search
CPC .............................................. G01R 31/2834
See application file for complete search history.

(56) References Cited

U.S. PATENT DOCUMENTS

| | | | |
|---|---|---|---|
| 4,697,151 A | 9/1987 | Butler | |
| 5,883,523 A | 3/1999 | Ferland et al. | |
| 7,428,678 B1 | 9/2008 | Berndt et al. | |
| 7,495,591 B2 | 2/2009 | Moll et al. | |
| 2003/0217345 A1* | 11/2003 | Rajsuman | G01R 31/31813 716/102 |
| 2004/0066207 A1 | 4/2004 | Bottoms et al. | |
| 2008/0262778 A1* | 10/2008 | Katagiri | G06F 11/263 702/119 |
| 2009/0105983 A1* | 4/2009 | Variyam | G01R 31/31905 702/124 |

(Continued)

OTHER PUBLICATIONS

International Search Report and Written Opinion dated Jul. 13, 2017 in International Patent Application No. PCT/US17/22888, 13 pages.

*Primary Examiner* — Ajay Ojha
(74) *Attorney, Agent, or Firm* — Shook, Hardy & Bacon, L.L.P.

(57) ABSTRACT

The testing and operating of remote devices are discussed. More particularly, signals are generated and/or received by remote devices, analyzed, logged, and displayed. Signals to remote devices are provided. Enhancements to the operability, capabilities, and functionality of such previously available testing equipment, are provided, via the operation of a remote, portable, and lightweight test bed. The test bed is operated and controlled remotely via a user-computing device. The test bed senses, probes, and/or controls a remote device and test data is automatically generated and/or acquired. The test data is provided to the user-computing device for automated analysis, visualization, and test report generation.

20 Claims, 9 Drawing Sheets

(56) References Cited

U.S. PATENT DOCUMENTS

2009/0119054 A1* 5/2009 Adachi ............ G01R 31/31907
 702/119
2013/0030753 A1 1/2013 Wong et al.
2016/0291057 A1* 10/2016 Chen .................. G01R 31/2834

* cited by examiner

REMOTE SENSING AND PROBING OF HIGH-SPEED ELECTRONIC DEVICES

CROSS REFERENCE TO RELATED APPLICATIONS

The application claims priority to U.S. Provisional Patent Application No. 62/310,408, filed on Mar. 18, 2016, entitled REMOTE SENSOR, PROBER, AND STIMULATOR (SPS) tool, the entirety of the contents herein incorporated.

BACKGROUND

Electronic components, such as analog, digital, and mixed-signal components, generally receive input signals and/or provide output signals via one or more pins and/or terminals. For various reasons, it is often desired to test the operation of such components by providing known and/or controlled signals to and/or observing/measuring the tput signals at the terminals. Various specialized testing systems or hardware, such as a digital and/or analog multimeters, oscilloscopes, analyzers, and the like, have been developed to enable such testing of elrctronic components.

However, such specialized testing system:have limitations and/or may not be ideally suited for every application. For instance, such systems may be expensive, bulky, or otherwise not well situated for remote testing. Additionally, it lnay limit the lifetime of such expensive testing equipment to subject the equipment to harsh environments, such as radiation environments Furthermore, some of today's digital components may be operated at speeds greatly exceeding several GHz. When testing the operation of some components, it is often desirable to operate the components nears speeds of actual usage. The testing equipment may provide and receive such signals over a signal transmission medium. One popular signal transmission medium for such testing equipment may include electrically conducting wires. Various aspects signal transmission medium to carry such high-speed signals may be greatly cc ained due to at least the non-instantaneous travel time and other aspects relating to the physics of signal transmission. Such constrained aspects of the transmission medium include but are not limited to total signal travel length, impedance, resistance, and other signal at ter a aspects. it is for these and other concerns that the following disclosure is provided.

SUMMARY

The various embodiments herein are directed towards systems and methods for testing and/or operating remote devices. Such remote devices include, but are not otherwise limited to electronic components (analog, digital, mixed-signal), sensors, and/or detectors. Various non-limiting embodiments of a method for sensing and/or probing a device-under-test (DUT) include employing a user device to generate test instructions. The test instructions may be based on one or more test configurations. A communication network may be employed to provide the test instructions from the user-computing device to a remote testing unit (RTU). In some embodiments, the test instructions may be provided to a first communication module of the RTU. The DUT may be communicatively coupled to a second communication module of the RTU. One or more logic devices of the DUT are employed to execute the test instructions.

In response to the executed test instructions, the second communication module of the RTU is employed to receive incoming test signals. The test signals may be generated by the DUT. The method may further employ logic devices of the RTU to generate test data based on incoming test signals. The first communication module of the RTU and the communication network may be employed to provide the test data to the user-computing device.

In various embodiments, the method further includes employing a signal generation and detection (SGD) module of the RTU, in response to the executed test instructions, to generate outgoing test signals. The second communication module of the RTU may be employed to provide the outgoing test signals to the DUT. The DUT may generate the incoming test signals in response to the provided outgoing test signals. The test data may be further based on the outgoing test signals. For instance, at least a portion of the outgoing test signals and at least a portion of the incoming test signals are encoded in the test data.

The method may further include employing signal-conditioning components of the SGD module to condition the outgoing test signals. The conditioned outgoing test signals are provided to the DUT via the second communication module. The signal conditioning components may be employed to also condition the incoming test signals. The logic device of the RTU is employed to generate signal parameters based on the incoming test signals. Furthermore, signal conversion components of the RTU may be employed to sample a portion of the incoming test signals. The logic device of the RTU is employed to generate the test data based on the signal parameters and the sampling of the incoming test signals, i.e. the incoming test signals are encoded in the test data via signal parameters and/or quantization via sampling the incoming test signals.

The first communication module of the RTU may employ Internet protocols (such as but not limited to at least a portion of the internet protocol suite TCP/IP) to provide the test data to the user-computing device. In contrast, the second communication module of the RTU may include various components (such as but not limited to functional blocks) that convert the incoming test signals between serial encoding and parallel encoding, e.g. SerDes communication protocols. In some embodiments, the second communication module may be similar to the first communication module. For instance, if the RTU is used as a communication extender or buffer.

The method may include enabling a user to employ the user-computing device to include an arbitrary waveform in the test configuration. The user-computing device is employed to generate waveform data based on a sampling of the arbitrary waveform. In some embodiments the user-computing device is employed to extract waveform parameters from the waveform. The test instructions are based on the sampling of the waveform and/or the extracted waveform parameters.

The incoming test signal may be an output signal of the DUT. The output signal of the DUT is encoded in the incoming test data. A display device of the user-computer device may be employed to provide a visualization of the output signal of the DUT. A test report may be generated based on the output signal of the device. The test report may be provided to one or more users. In some embodiments, the DUT is an operational amplifier (op-amp). In other embodiments, the DUT is a logic device, a digital circuit or part of the human-body.

DETAILED DESCRIPTION

Figure 1:
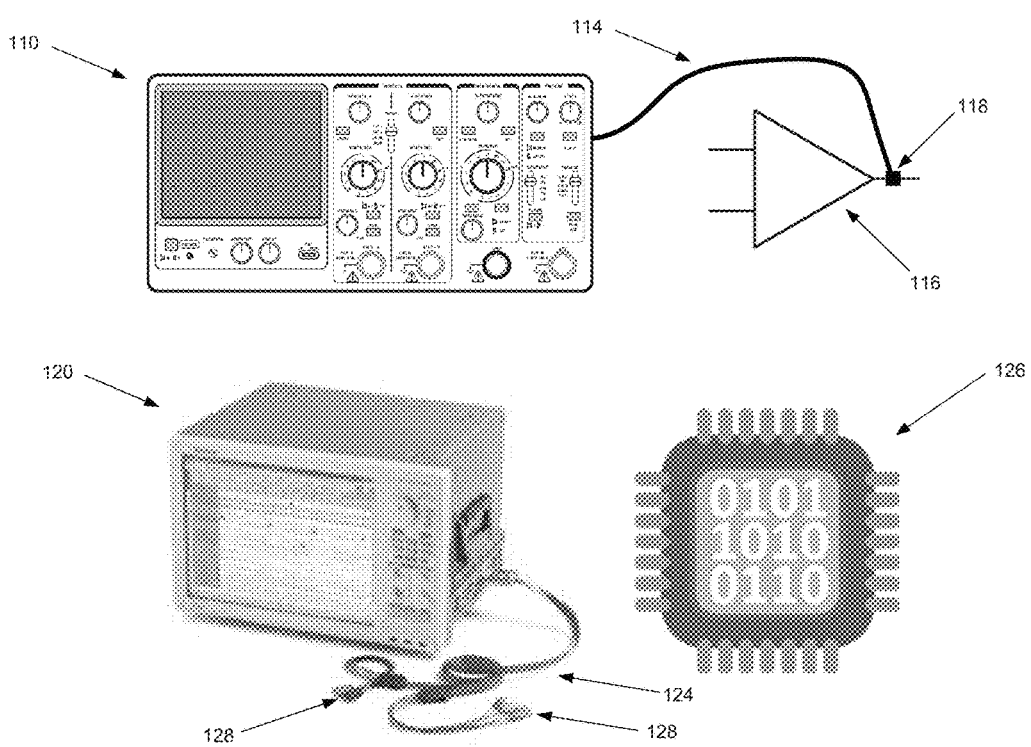
FIG. 1 illustrates various embodiments of prior art electronic device testing systems.

As used herein, the term "device" may refer to any component that can receive and/or provide a signal, such as but not limited to a time-varying electronic signal. Thus, devices may include discrete and/or integrated electronic components, such as analog, digital, and/or mixed-signal discrete and/or integrated components. For instance, devices may include discrete transistors, resistors, inductors, diodes, and the like. Devices may include amplifiers, or other such discrete and/or integrated electronic components. Devices may further include integrated circuits, such as but not limited to application specific integrated circuits (ASICs), field programmable gate arrays (FPGAs), microprocessors, microcontrollers, central processing units (CPUs), and the like. Other devices may include volatile and/or non-volatile memory devices (e.g. SRAM, DRAM, EEPROM, FLASH, and the like), as well as virtually any other integrated circuit (IC). Devices may include photon sources, such as but not limited to light emitting diodes (LEDs), lasers, and the like.

In the embodiments, a device may include one or more sensors and/or detectors that generate and/or detect one or more signals. Photon sensing devices may include any device that converts photon energy into a signal, e.g. photodiodes, CCDs, solar cells, image sensors, cameras, and the like. In addition to generating a signal, devices may sense one or more signals generated by other devices, i.e. a sensor device. Such sensor devices include any component that can sense a signal, i.e. electronic signal sensors, voltage sensors, current sensors, resistance sensors, impedance sensors, and the like. Other devices employed as sensors may include thermistors. In various embodiments, a sensing device may include a light detection and ranging (LIDAR) system.

Devices may include one or more other sensors, such as temperature sensors (such as but not limited to thermistors), moisture sensors, pressure sensors, altitude sensors, position sensors (such as but not limited to global positioning (GPS) transceivers), orientation sensors (i.e. accelerators), acceleration sensors, velocity sensors (e.g. a GPS transceiver employed as a velocity sensor), and the like. Such sensor devices may include various sensors associated with wearable devices, i.e. heart rate monitors, pedometers, electrocardiogram (EKG) sensors. Sensor devices may further include biometric sensors, such as but not limited to fingerprint identification sensor, facial recognition sensors, retinal (or iris) scan sensors, or the like. Other sensors may include environmental sensors, climate sensors, or virtually any other sensor. More generally, a device is any component and/or sensor/detector that, under test (and/or operation), may receive one or more input signals, generate and provide one or more output signals, and/or sense/detect one or more signals. Furthermore, as discussed throughout, devices may include interactive gaming technologies (such as but not limited to various gaming controls), wearable devices (for instance, but not limited to haptic-feedback enabled gloves), virtual-reality (VR) devices (such as but not limited to VR headsets), augmented-reality (AR) devices, and the like. Such devices may include haptic-devices (i.e. devices that generate and sense haptic feedback). Devices may include virtually any internet-of-things (IoT) devices As used herein, the terms "test" or "testing" may refer to the providing of one or more signals to and/or receiving one or more signals from one or more devices. That is to say, testing a device refers to probing (providing input signals to) a device-under-test (DUT) and/or sensing (receiving output signals from) the DUT. It should be noted that as used herein, testing is not limited to operating and/or detecting/measuring the operation of a DUT for the purposes of determining the operational boundaries on the DUT. Rather, herein, testing a device more generally refers to operating and/or measuring the operation of the device for virtually any purposes whatsoever. That is, testing a device may refer to operating the device for the purposes of the device's manufacturer. Thus, a DUT may be any component that is being operated, probed, and/or sensed, i.e. any component that is being provided signals and/or generating signals that are being detected and/or sensed.

As used herein, "testing configuration" may refer to one or more sets of inputs to be employed in the testing of a DUT. Thus, a test configuration may include one or more test vectors. Such test vectors may include at least encodings of one or more signals to provide to a DUT. The signals may include one or more waveforms. Thus, a test configuration may include one or more waveforms and/or pulses. The waveforms/pulses may be repeating waveforms, pulsed waveforms, or any combination thereof. The waveforms may be readily parameterized. For instance, a test configuration may include a parameterization of a waveform via a discrete and/or continuous frequency spectrum, sets of orthonormal basis functions and expansion coefficients, coefficients encoding one or more amplitudes, frequencies, or the like, or any other means of encoding a waveform. In some embodiments, a test configuration may include one or more waveforms that are not readily or easily parameterized (i.e. the amount of information required to parameterize the waveform exceeds the amount of information required to adequately encode the waveform via sampling techniques).

A testing configuration may include a list of sensors, detectors, probes, or other devices (or channels thereof), to operate. More generally, a testing configuration may include a list, sequence, or set of inputs that are associated with testing and/or operating a device. For instance, a test configuration may include any set of inputs that a user could provide to one or more channels of one or more oscilloscopes, logic analyzers, waveform/pulse generators, multimeters, circuit testers, or any other such device testing equipment. Similarly, a testing configuration may include any set of inputs a user could provide to operate virtually any detector and/or sensor device such as but not limited to any of the sensor devices discussed above. Generally, a testing configuration may refer to one or more testing parameters, testing vectors, and/or other encodings that define one or more probing and/or sensing operations to carry out on one or more DUTs. For instance, a testing configuration may include one or more testing encodings that encode one or more test parameters and/or test vectors for one or more DUTs.

As used herein, the term "logic device" may refer to any device enabled to carry out logic operations, such as but not limited to machine-executable instructions, logic-gate configurations, and the like. Thus, a logic devices may include, but are not limited to one or more of microprocessors, microcontrollers, central processing units (CPUs), field programmable gate arrays (FPGAs), application specific integrated circuits (ASICs), graphic processing unit devices (GPUs), digital signal processing (DSP) devices, and the like, As used herein, the term "testing instructions" may refer to any machine-readable and/or machine-executable instructions that enable one or more testing configurations. For instance, testing instructions may refer to a list of instructions (and/or encodings) that when provided to a logic device, such as but not limited to a microprocessor, microcontroller, CPU, FPGA, ASIC, enable the logic device to perform steps and/or actions to carry-out or perform the test, as encoded and/or indicated by the testing configuration.

Briefly stated, the various embodiments herein are directed towards systems and methods for testing and/or operating remote devices. Such remote devices include, but are not otherwise limited to, electronic components (analog, digital, mixed-signal), sensors, and/or detectors. The various embodiments provide cost-effective, convenient, and flexible means for the sensing and/or probing of (i.e. testing) remote devices. Some embodiments are directed towards receiving signals generated by remote devices (i.e. sensing the remote devices). Other embodiments are directed towards providing signals to remote devices (i.e. probing the remote devices). Still other embodiments are directed to both receiving signals from and providing signals to remote devices (sensing and probing the remote devices).

Non-limiting embodiments enable functionalities and operations associated with electronic test-equipment, such as but not limited to electronic meters, such as but not limited to current meters, voltage meters, resistance meters, impedance meters, and/or other electronic signal sensors and/or meters. Other such electronic testing equipment includes, but is not otherwise limited to oscilloscopes, logic analyzers, bus analyzers, (vector) network analyzers, spectrum analyzers, (arbitrary) waveform/pulse generators, circuit testers, and the like. As described herein, the various embodiments provide enhancements to the operability, capabilities, and functionality of such previously available testing equipment.

The various embodiments enable the operation of a remote, portable, and lightweight test bed (herein referred to as a remote test unit, or RTU), via a computing device. The RTU senses, probes, and/or control a remote device (herein referred to as a device-under-test, or DUT). The RTU may communicate with the computer device via a first onboard communication module. The RTU may communicate with the DUT via a second onboard communication module. The operational speed (i.e. the speed of the communication protocols, busses, and the like) of the second onboard communication module may be significantly greater than the operational speed of the first communication module. That is, the communication bandwidth of the first communication module may be significantly less than the communication bandwidth of the second communication module.

Thus, the communication bandwidth of the sensing and probing of the remote DUT is limited by the communication bandwidth of the second communication module (and not the first communication module). For instance, the computing device may provide control over a test of a remote DUT via relatively low communication bandwidth associated with TCP/IP data packets. The RTU includes a significant amount of data storage, signal generation, signal detection, and signal-processing capabilities to generate and transmit test signals (to and from the DUT) at speeds that match the operational speed of the DUT, via the second communication module. Thus, test signals may be provided to and received from the DUT, at a communication bandwidth that is significantly greater than the bandwidth associated with TCP/IP communication.

A testing application (TA) is hosted at a computing device. The TA is enabled to provide complete control over the RTU, and hence the DUT. The TA is also enabled to generate various user-interfaces (UIs) that emulate user interfaces of testing equipment. Such emulated test equipment includes, but is not limited to oscilloscopes, logic analyzers, pulse/waveform generators, multimeters, circuit testers, and the like. Thus, a user may employ the various embodiments as complete replacements for such testing equipment.

However, the embodiments are not limited to testing devices. For instance, a TA and an RTU may be employed to operate, control, and collect data from various sensors, such as but not limited to cameras, LIDAR systems, and the like. Rather, the various embodiments of an RTU provide a platform to sense, probe, and control virtually any type of remote devices, including but not limited to electronic components, sensors, detectors, and other remote systems.

FIG. 1 illustrates various embodiments of prior art electronic device testing systems. Oscilloscopes, such as oscilloscope 110 have previously been available. Such oscilloscopes are traditionally deployed to sense (i.e. measure and/or detect), log, and/or display time-varying signals, such as current, voltage, and other signals generated by an electronic component, such as but not limited to operational amplifier (op-amp) 116. A test probe 118 (or sensor) is communicatively coupled an output terminal and/or pin of op-amp 116 and signal transmission wire 114. In response to input signals, op-amp 116 generates and provides one or more time-varying output signals to the output terminal. Test probe 118 senses (or measures) the output signal. Transmission wire 114 transmits the output signal to the oscilloscope 110, where it can be observed, displayed, stored, logged, and/or analyzed.

Similarly, logic analyzers, such as logic analyzer 120 have previously been available. Such logic analyzers are traditionally deployed to provide and sense (i.e. measure and/or detect) multiple signals to electronic components, such as but not limited to digital microprocessor 126. Test probes, such as test probes 128, are connected and/or coupled to various pins or terminals of microprocessor 126. Furthermore, logic analyzer 120 may simultaneously generate and/or sense multiple signals to and/or from the multiple pins of microprocessor 126. As such, multiple test probes 128 may be employed. One or more transmission wires 124 transmit the signals between the logic analyzer 120 and the microprocessor 126.

More particularly, logic analyzer 120 generates signals, which are transmitted to microprocessor via transmission wires 124 and test probes 128. Thus, test probes 128 may be sensors. In response to the provided signals, microprocessor 126 generates output signals, which are transmitted to the logic analyzer 120 via test probes 128 and transmission wires 124. Each of the generated and received signals may be observed, displayed, stored, and/or analyzed at logic analyzer 120.

Aspects of these prior art systems include the generation of input test signals at the test unit (i.e. logic analyzer 120). Once generated, these signals must be transmitted over transmission wires 124. Also, output signals generated by the device-under-test (DUT) (i.e. op-amp 116 and microprocessor 126) must be transmitted to test unit (oscilloscope 110 and/or logic analyzer 120) via transmission wires 114/124. As such, the distance between the DUT and the test unit is limited to the practical considerations of the lengths of transmission wire lengths.

The length of a transmission wire contributes to engineering considerations, such as limits imposed on signal frequency, signal interference, signal attenuation, signal impedance, and the like. At any rate, these prior art systems necessitate a relative close proximity between the DUT and the test unit, even for relatively low-speed signals. In some test operations, the DUT may be placed in a relatively harsh environment, such as a radiation environment, that may be destructive and/or hazardous for an expensive testing unit and/or a human user.

The various embodiments of the present invention overcome these and many other limitations of oscilloscopes, logic analyzers, waveform/pulse generators, circuit testers, and other previously available testing systems. Furthermore, the various embodiments provide many of the extended and flexible capabilities and/or functionalities for the remote testing of components. For instance, such previously available systems may be expensive, massive, large in physical dimensionality, relative immobile (i.e. difficult and/or impractical to transport and/or ship), not suited to harsh environments, limited and/or constrained in the number of available signal channels, limited in data analysis and data storage. Furthermore, the various embodiments provide significant improvements and increased flexibility in user interactivity, control, and customization of the use and operation of such previously available systems.

More specifically, the various embodiments herein overcome the limitations of the length of transmission wires, as well as the limited number of signal channels, associated with previously available systems. The various embodiments leverage the increased capabilities associated with mobile computing devices and distributed computing system (i.e. "cloud services") to overcome the limitations associated with the size, mass, expense, data analysis/processing/logging/displaying associated with previously available test systems. Additionally, various applications, such as mobile applications and/or "cloud"-provided services increase the flexibility of user interactivity and control of testing conditions and data analysis/reporting.

Exemplary Image Generation System

Figure 2:
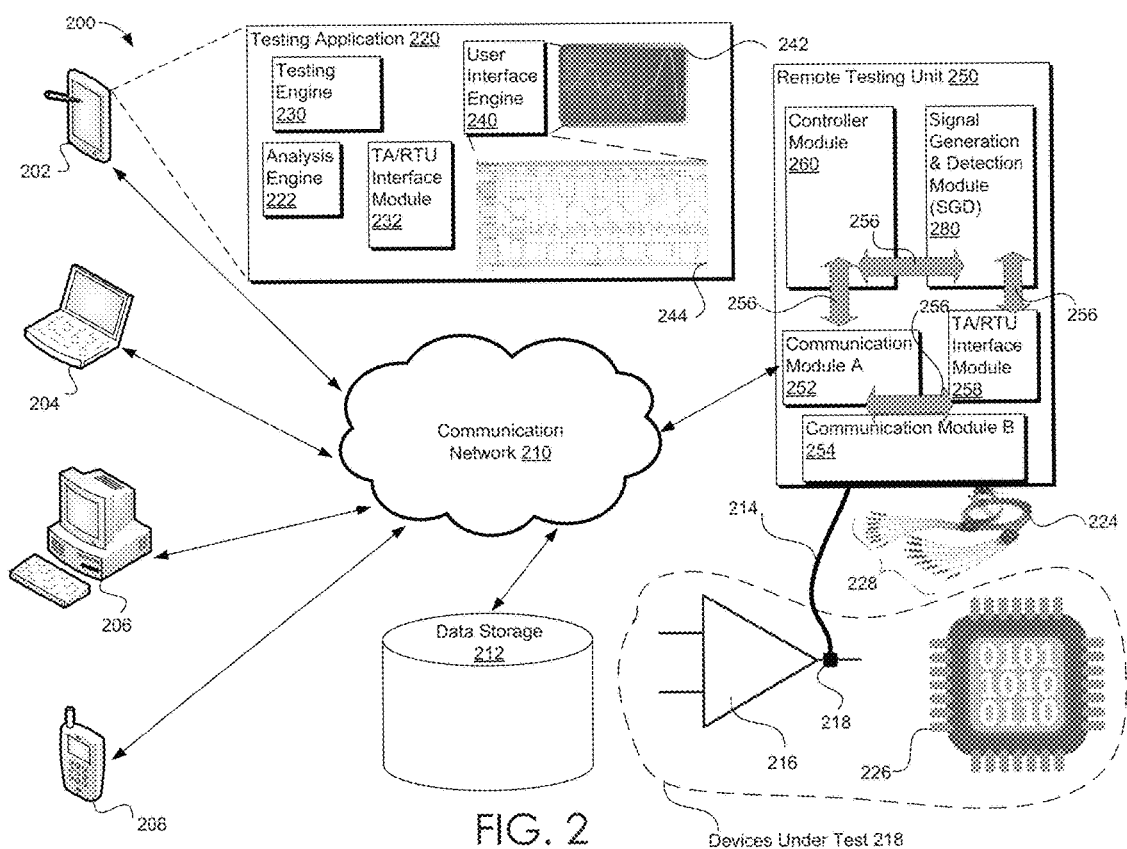
FIG. 2 illustrates an exemplary embodiment of a remote testing system that is consistent with the various embodiments presented herein.

FIG. 2 illustrates an exemplary embodiment of a remote testing system that is consistent with the various embodiments presented herein. System 200 includes one or more user-computing devices, such as but not limited to tablet device 202, laptop 204, desktop computing device 206, smartphone 208, server, data-center, and the like. System 200 may include and/or employ virtually any computing device as a user-computing device. Various embodiments of a computing device are discussed in conjunction with at least computing device 700 of FIG. 7. Other embodiments may include more, less, additional, and/or alternative computing devices. For instance, although not shown in FIG. 2, system 200 may include one or more television streaming devices, employed as a user-computing device. Wired and/or wireless communication network 210 may communicatively couple any user-computing device, such as but not limited to user-computing devices 202-208.

System 200 may also include data storage 212. Data storage 212 may store any of the testing configurations, test instructions, test data, test signals, computer-executable instructions, test reports, or any other data associated with system 200. Data storage 212 may include localized and/or distributed non-transitory non-volatile and/or volatile one or more computer-readable storage media. Data storage 212 may include virtualized computer-readable storage media (i.e. data storage 212 may include "cloud"-based data storage). Communication network 210 may communicatively couple data storage 212 to various user-computer devices, such as but not limited to user-computer devices 202-208.

Wired and/or wireless communication network 210 may be any communication network, including virtually any wired and or wireless communication technologies, wired and/or wireless communication protocols, and the like. It should be understood that communication network 210 may be virtually any communication network that communicatively couples a plurality of computing devices and databases in such a way as to enable users of computing devices to exchange information via the computing devices.

Various user-computing devices, such as at least one of user-computing devices 202-208 may host and/or enable testing application (TA) 220. FIG. 2 shows tablet device 202 hosting TA 220, other user-computing devices, such as but not limited to user-computing devices 204-208 may host TA 220. In one non-limiting embodiment, a television streaming-device (not shown in FIG. 2) may be employed as a user-computing device and host TA 220. TA 220 may be distributed across multiple user-computing devices. In at least one embodiment, TA 220 is hosted by one or more server computing devices. In such embodiments, users may access the functionalities and/or services of TA 220, as client computing devices to the one or more host computing devices. In at least one embodiment, TA 220 may be hosted by one or more web-based (and/or "cloud"-based) server computing-devices. In such embodiments, client computing-devices may access the functionalities via web (and/or "cloud") services provided by the one or more web-server computing devices. In at least one embodiment, TA 220 is hosted by one or more virtual machines (VMs). TA 220 includes a testing engine 230, an analysis engine 222, testing application-remote testing unit (TA/RTU) interface module 232, and a user interface (UI) engine 240. UI engine 240 may generate one or more UIs, such as but not limited to UI displays 242 and 244.

System 200 includes one or more remote testing units (RTUs). FIG. 2 shows exemplary, but non-limiting, RTU 250. Various embodiments of RTUs are discussed in conjunction with at least RTU 350 of FIG. 3A. However, briefly here, RTU 250 includes a controller module 260, a signal generation and detection (SGD) module 280, two or more communication modules, a TA/RTU interface module 258, and various generalized communication busses 256. Various embodiments to TA/RTU interface modules, such as TA/RTU interface module 232 of TA 220 and TA/RTU interface module 258 of RTU 250 are discussed in conjunction with at least TA/RTU interface module 300 of FIG. 3B.

RTU 250 includes at least a first communication module (communication module A 252) and a second communication module (communication module B 254). Generalized communication busses 256 communicatively couple each of communication module A 252, controller module 260, SGD module 280, and communication module B 254. RTU 250 may include similar, equivalent, and/or alternative functionalities, engines, modules, components, or the like as RTU 350 of FIG. 3A. As such, RTU 250 may be enabled to provide similar and/or equivalent operations/functionalities to those of RTU 350.

Communication module A 252 is enabled to communicatively couple RTU 250 to various user-computing devices (including but not limited to user-computing devices 202-208), via communication network 210. Communication module A 252 may further communicatively couple RTU 250 to data storage 212. More specifically, communication module A 252 may be coupled to communication network 210 via any wired and/or wireless technologies, communication protocols, or the like. Thus, communication module A 252 and communication network 210 may communicatively couple TA 220.

Communication module B 254 is enabled to communicatively couple RTU 250 to one or more devices under test (DUTs) 218, such as but not limited to operational amplifier (op-amp) 216 and digital microprocessor 226. Although not shown in FIG. 2, communication module B 254 is enabled to communicatively couple RTU 250 to other devices, including various photon generators and detectors (i.e. photo light emitting diodes (LEDs), lasers, cameras, LIDAR systems, and the like). FIG. 2 shows signal transmission wire 214 and test probe 218 communicatively coupling an output terminal of op-amp 216 to communication module B 254, and this RTU 250. Similarly, signal transmission wires 224 and test probes 228 may be employed to communicatively couple microprocessor 226 to RTU 250, via communication module B 254. Thus, one or more DUTs 218 may be communicatively coupled to TA 220 via one or more test probes, signal transmission wires, communication modules A/B, communication busses, sensors, and/or communication network 210.

Various embodiments of remote testing systems discussed herein, such as but not limited to system 200, may be employed to remotely sense and/or probe various devices-under-test (DUTs). For instance, DUTs 218, including but not limited to analog operational amplifier (op-amp) 216 and a digital microprocessor, may be remotely sensed and probed via various embodiments of remote testing systems. That is to say, system 200 is enabled to remotely provide and/or receive test signals to one or more DUTs. Furthermore, system 200 is enabled to generate test data based on the provided and/or received test signals. Such test data may be automatically processed, analyzed, displayed, logged, and/or stored via system 200. In some embodiments, system 200 may automatically generate and/or prepare a test report. Such test data and/or test reports, may be remotely provided and/or transmitted to other computing devices not shown and/or not included in system 200. Thus, system 200 may be employed to test remote DUTs. In general, various embodiments of remote testing systems, such as system 200, may include less, more than, similar, and/or alternative components than that shown in FIG. 2.

More specifically, a user may provide TA 220 one or more testing configurations (i.e. test definitions) via one or more UIs generated via UI engine 240. Such UIs may be configured to emulate any interface of traditional testing systems, such as but not limited to oscilloscopes, logic analyzers, pulse/waveform generators, multimeters, and the like. Such UIs may emulate any input and/or output interfaces of such testing equipment. Accordingly, a user may provide testing configurations via one or more UIs or TA 220. Furthermore, a user may be provided visualizations of test data, be provided test reports, or be provided other such information via TA 220.

One or more of the UIs may enable the automated generation of test designs (i.e. test configurations) for virtually any DUT, including but not limited to digital, analog, and missed-signal electronic devices and/or circuits. Various test libraries may be included in TA 220 to enable the user to provide test configurations based on the test libraries. As described below, the UIs enable the user to remotely control, configure, and program the RTU via the test configuration. The UIs also enable the user to view, analyze, and interact with the test data.

TA 220 may be enabled to provide computer-aided design guidance and/or guidelines to the user, when the user is providing the test configuration. For instance, TA 220 may suggest fault-tolerance guidelines. TA 220 may be enabled to analyze a particular test configuration. TA 220 may determine test configurations that would result in test conditions that violate the specification of a DUT, or would otherwise operate the DUT in an unintended and/or unsafe fashion. TA 220 may base such analysis on an automatic access of device specifications, and the like via communication network 210.

Testing engine 230 may generate test instructions based on the test configurations. The test instructions are provided to RTU 250 via communication network 210 and communication module A 252. Controller module 260 may include one or more logic devices that are enabled to execute the test instructions and/or be configured to perform logic operations that carry out the test-instructions, e.g. be configured via logic gate arrays. In response to the execution of the test instructions, SGD module 280 may generate one or more outgoing test signals. The outgoing test signals are provided to communication module B (via generalized communication bus 224). Communication module B 254 may provide (or transmit) the outgoing test signals to a DUT, such as but not limited to microprocessor 226, via signal transmission wires 224 and test probes 228.

Note that the controller module 260 may be operated at virtually any speed, only limited by the controller components included in controller module 260 and communication module B 254. For instance, controller module 260 may generate and provide outgoing test signals at signal frequencies in the GHz range, as well as receive incoming test signals at similar frequencies. For instance, serializer/deserializer (SerDes) communication blocks may be employed.

Incoming test signals (i.e. signals generated by a DUT) may be similarly received by communication module B 254 via transmission wires and test probes. RTU 250 may generate, store, and/or buffer test-data based on the outgoing and incoming test data. For instance, RTU 250 may include various volatile and/or non-volatile storage components to store and/or buffer the test data and/or the test signals. The test signal/test data acquisition and storage may be run in pipeline mode to avoid data loss.

Once at least a first portion of the incoming test signals have been received and stored, at least a portion of the test data may be provided to TA 220. Communication module A 252 may provide TA 220 the testing data, via communication network 210. A test data pipeline may be employed so that RTU 250 provides test data to TA 220, while continuing to acquire, store, and/or buffer additional test data. Communication module A 252 may transmit the test data, via a sequence of data packets. In various embodiments, the data packets are encoded and transmitted via various communication protocols such as but not limited to Transmission Control Protocol/Internet Protocol (TCP/IP). Thus, in some embodiments, the data packets may be TCP/IP data packets.

In at least some embodiments, radio, microwave, or other wireless telecommunications protocols may be employed by communication module A 252 in the transmission of the test data packets. That is to say, each of communication module A 252 and a device hosting TA 220 may include modem communication devices with both ends fulfilling the two sides of a modem (modulator and demodulator of signals).

In some embodiments, a dedicated and/or specialized communication protocol is employed. In such embodiments, both ends (computing device that host the TA and the RTU) may be equipped with software-based and/or hardware based middleware's to enable the integration of modem-like functionalities. Such a specialized communication protocol can be as fast as a telecommunication modem allows. Consequently, the signal transmission can operate in the Ka-Band region (with frequencies up to 30 GHz) and will not be limited by the speeds of existing Internet-protocols. This will also enable higher-speed end-to-end and/or multi-end communications, compared the current TCP/IP communication protocols.

Advantages of embodiments that employ TCP/IP data packets are that the communication protocols are well mature and established in the industry, so it is easy to use and there is no need for frequent hardware upgrades, i.e. software upgrades are sufficient. The system can use a hardware-based middleware for telecommunication transmissions on both ends (computing device and RTU), even when using TCP/IP Internet communication protocols. That is, rather than employing existing and generic industry modems and routers, some of the embodiments may employ hardware-based and/or software-based middleware and integration in the RTU and/or the TA designs.

At least a portion of the test signals may be encoded in the test data via one or more signal parameters (e.g. frequencies, amplitudes, expansion coefficients and/or distributions in the frequency domain, and the like). Other portions of the test signals may be encoded in the test data via digitization technique, i.e. the sampling of the signal. The various embodiments may employ signal parameterization or digitization (i.e. sampling) depending on the complexity and/or amount of information encoded in the test signals and the test data. That is, the more efficient method of information encoding (parameterization vs. digitization) may be employed based on the test signal to be encoded. The more efficient method may be selected and employed.

One or more of the test data packets, provided to TA 220, may be separated by various communication protocol handshake signals. Error correction and/or detection (EDAC) protocols may be employed by RTU 250 and TA 220 to insure test data integrity. Such EDAC protocols may include, but are not otherwise limited to checksum encodings, Hamming encodings, handshake signals, and the like. In at least one embodiment, the test packets may be encrypted and decrypted via various cryptography protocols to insure test data security.

Note, that the test data may be provided, via communication module A 252, simultaneous with the test data acquisition, via communication module B 254, via one or more test data pipelines. In the event of one or more test data transmission errors, the depth of the test data pipeline may be increased to re-transmit the corrupted test data. In various embodiments, test data stored on the onboard storage components of RTU will only be erased and/or re-written over, once the non-corrupted transmittance to TA 220 has been verified via one or more EDAC protocols, such as but not limited to various handshake protocols.

Analysis engine 222 may process/analyze the test data. In at least one embodiment, at least portions of the test data may be displayed via UI displays 242/244. As noted above, UIs may emulate virtually any test equipment input/output user interfaces to provide visualization tools for the test data. Analysis engine 222 may generate one or more test reports. The test data and/or the test reports may be provided to one or more other user-computing devices and/or data storage 212. Accordingly, the test data may be logged via TA 220 for further processing, analysis, and/or presentation.

In some embodiments, communication module A 252 and communication module B 252 are similar communication modules. In such embodiments, RTU 250 may be considered to include multiple communication modules A and/or multiple communication modules B. One of the communication module A is employed to communicate with TA and the other communication module A is employed to communicate with multiple other RTUs (extend the communication range) or TAs (for different types of applications).

That is to say, multiple RTUs with or without TAs and similarly multiple TA(s) with or without RTU(s) may be daisy chained together. Note that system 200 may include a distributed and/or cloud-based system and/or platform that may be (re-)programmed and/or (re-)configured via various application program interfaces (APIs) provided via TA 220. That is to say, various embodiments of system 220 may provide an API suite that enables the user to (re-)program and/or (re-)configure TA 220 and RTU 250 remotely via cloud-based and/or web-based services. Such re-programmability and/or re-configurability enables system upgrades and/or enhancements without upgrading the underlying hardware.

Multiple RTUs may communicate amongst themselves without a corresponding TA. Similarly, multiple instances of TAs may communicate amongst themselves without corresponding RTUs. For instance, a first user-computing device (running a first TA) and a second user-computing device (running a second TA) may transmit data (for instance test instructions and/or test data) between each other via TCP/IP data packets. The transmitted data may encode high-speed test signals (e.g. signals with frequencies on the order of GHz). The test signals may be encoded via parameters and/or sampling techniques. The first user-computing device may transmit signal parameters (e.g. amplitude and frequency signals parameters) for a 10 GHz square waveform. The second user-computing device may receive these signal parameters, decode them, and display the parameterized 10 GHz square waveform. Thus, test data may be generated via the first TA and displayed and/or analyzed via the second TA without an RTU between the TAs.

Due to this programmability and/or configurability via communication ports, various software applications can be enabled. For instance, a user may design and/or define various software-defined oscilloscopes, digital analyzers, and the like applications. Such application may access the functionalities of TA 220 and RTU 250 via APIs. Because RTU 250 is equipped with various communication functionalities via radios, various software-defined radio applications may be instantiated with APIs. It should be understood that multiple RTUs may be daisy-chained, i.e. a communication module (A and/or B) of one RTU and a communication module (A and/or B) of another RTU may be employed to communicatively couple the two RTUs. Furthermore, TA 220 may be communicatively coupled to multiple RTUs. Thus, large, distributed (i.e. cloud-based) systems may be implemented to simultaneously sense and/or probe multiple DUTs that may be distributed in physically distinct locations.

Exemplary Remote Testing Unit

Figure 3A:
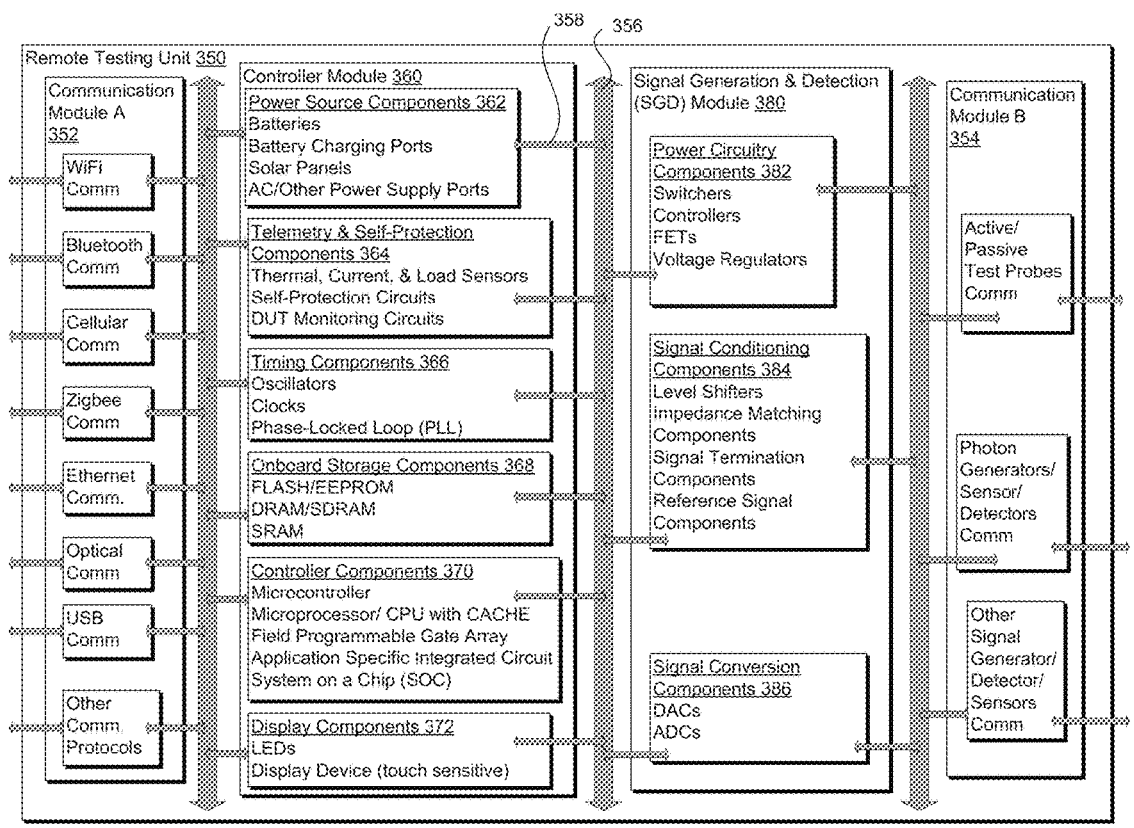
FIG. 3A schematically illustrates an exemplary embodiment of a remote testing unit that is consistent with the various embodiments presented herein.

FIG. 3A schematically illustrates an exemplary embodiment of a remote testing unit that is consistent with the various embodiments presented herein. Similar to RTU 250 of FIG. 2, RTU 350 may be a portable, lightweight, and mobile test-bed. RTU 350 may include similar (and/or equivalent) modules, components, functionalities, and the like to that of RTU 250 of FIG. 2. As such, RTU 350 includes two or more communication modules (i.e. communication module A 352 and communication module B 354). RTU 350 also includes a controller module 360 and a signal generation and detection (SGD) module 380. Although not shown in FIG. 3A, RTU 350 may include one or more TA/RTU interface modules, such as but not limited to TA/RTU interface module 258 of FIG. 2 and/or TA/RTU interface module 300 of FIG. 3B.

It should be noted that any module and/or component included in RTU 350 may be communicatively coupled to any other included module and/or component via one or more general and/or specific communication busses. One exemplary, but non-limiting embodiment of communicatively coupling the various modules and/or components of RTU 350 is schematically represented in FIG. 3A via the bi-directional arrows. For instance, bi-directional arrows 356 and 358. Other arrangements of communication busses may be employed to communicatively couple the modules and/or components. At least a portion of the communication busses may be bi-directional communication busses. Another portion of the communication busses may be uni-directional.

The communication busses may be serial busses, parallel busses, or any combination thereof. Such exemplary communication busses include, but are not otherwise limited to universal serial busses (USB), serializer/deserializer (SerDes), peripheral component interconnect (PCI) busses, optical busses, mezzanine busses, and the like. Note that in addition to transmitting communication signals, at least a portion of these busses may be enabled to transport power signals, i.e. transmit power to the various modules and components to operate RTU 350.

Communication module A 352 is enabled to communicate (i.e. provide and/or receive) test data, test instructions, waveforms, test signals, clock signals, and the like to testing applications (TAs), such as but not limited to TA 220 of FIG. 2. For instance, communication module A 252 may be communicatively coupled to a user-computing device, such as but not limited to user-computing device 202 of FIG. 2, via one or more communication network, such as but not limited to communication network 210 of FIG. 2. In general, information communicated between communication module A 352 and one or more TAs may be referred to herein as "data stream A."

As such, communication module A 352 may include various communication components. Such communication components may include any hardware components, communication busses, communication ports, logic devices, radios, transceivers, communication connectors, test probes, and the like that enables the generations, processing, and transmission of (providing and receiving) data stream A, as well as any corresponding and/or related communication protocols. As such, communication module A 352 may include at least one of one or more WiFi communication components, one or more Bluetooth communication components, one or more cellular (4G and the like) communication components, one or more ZigBee communication components, one or more Ethernet communication components. In some embodiments, communication module 352 may include one or more optical communication components, one or more universal serial busses (USB) communication components, and any other communication components associated with other communication signals, protocols, and the like. Communication module A 352 may include various wireless telecommunication components, such as but not limited to radio-frequency (RF) (and other frequency) communication components that cover various wireless bands. The wireless bands covered via communication module A 352 may range from low frequency (e.g. 9 KHz) to high frequencies (e.g. up to 30 GHz). In various embodiments, communication module A 352 covers microwave wireless bands. With periodic signals, such as square waveforms where the main parameters to be transmitted to the RTU are frequency and amplitude, the result maximum frequency of the transmitted-signal from the TA to the DUT may be limited only by the analog path from the Module 360 outputs to the DUT. That will include Modules 380 and 354 (see FIG. 2). As an example, in the case of purely digital signals that can be generated directly from the digital controller, where modules 380 and 354 are not being used, the maximum frequencies can attain tens of Gigahertz's.

In contrast to communication module A 352, communication module B 354 is enabled to communicate (i.e. provide and/or receive) test data, test instructions, waveforms, test signals, clock signals, and the like to DUTs, such as but not limited to op-amp 216 and microprocessor 226 of FIG. 2. As discussed herein, communication module B 354 may be enabled to communication any such information to one or more sensors, detectors, and the like. For instance, communication module B 254 may be communicatively coupled to a DUT and/or sensor, such as but not limited to DUTs 218 of FIG. 2, via one or more signal transmission mediums, probes, wires, optical fibers, or the like. In general, information communicated between communication module B 352 and one or more DUTs, sensors, detectors, or the like may be referred herein to as the "data stream B."

Communication module B 254 may include ports for and/or employ one or more wireless communication protocols. In such embodiments, RTU 250 employs buffering techniques for high-speed (HS) signal transmission (i.e. hardware-based middleware) between a TA (or a dedicated computing device) and another RTU. The RTU can then be used to buffer and speed-up existing Internet communication protocols. A network of RTUs can be inserted then between the TA and the DUT and similarly a single or many RTUs may connect to multiple DUTs (distributed RTUs) where their communications can be synchronized through the TA.

As such, communication module B 354 may include various communication components. Such components may include any hardware components, communication busses, communication ports, logic devices, radios, transceivers, and the like that enable the generation, processing, and transmission of (providing and receiving) data stream B, as well as any corresponding and/or related communication protocols. As such, communication module B 354 may include at least one of one or more test probe communication components. For instance, active and/or passive test probes may be communicatively coupled via communication ports included in a test probe communication component. Communication module B 354 may include one other communication components, such as photon generator/sensor/detector communication components, as well as other communication components for other sensors, detectors, and/or signal generators. Similarly to communication module A 352, communication module B 354 may cover communication protocols over various wireless bands, such has but not limited to RF and microwave wireless communication bands.

In at least some embodiments, a communication bandwidth of communication module A 352 may be less than a corresponding communication bandwidth of communication module B 354. That is, a volume of transmitted information per unit time between communication module A 352 to/from one or more TAs may be less than a volume of transmitted information per unit of time between communication module B 354 and one or more DUTs. Thus, in some embodiments, communication module A 352 may be a "slow communication module" and communication module B 354 may be a "fast communication module."

Controller module 360 may include various power source components 362, various telemetry and/or self-protection components 364, various timing components 366, various onboard storage components 368, various controller components 370, and various display components 373. Briefly, power source components 362 may include any components associated with providing power for the operation of RTU 350. For instance, power source components 362 may include, but are not otherwise limited to batteries (rechargeable and/or replaceable), battery charging ports, solar panels, ports for external AC power for power from other power supplies. In various embodiments, communication ports includes included in one or more of the communication components in either communication module A and/or B 352/354 may be multiplexed to serve as power charging ports and/or AC power providing ports. For instance, USB ports of USB communication components can be multiplexed to provide power for charging the batteries. The communication ports in either communication module A and/or B 352/354 may be referred to as configuration and/or programmability ports. In some embodiments, the configuration ports of FPGAs (such as FPGAs included in controller components 370) and/or other configuration may be multiplexed to serve as power ports (i.e battery charging ports and/or AC power ports).

Telemetry and/or self-protection components 364 may include various components to monitor the operation of RTU 350, terminate and/or suspend the operation of RTU 350 for self-protection, and/or provide information about the operation of RTU 350 to a user (i.e. telemetry). Such telemetry and/or self-protection components 364 include, but are not otherwise limited to thermal, current, and load sensors. Such components 364 may additionally include self-protection circuits (e.g. fuses and the like), DUT monitoring circuits, and the like. Such self-protections circuits may protect the RTU 350 from latchup, over-voltage, under-voltage, short-circuit, thermal runaway, and other circuit malfunction events. Such self-protection and/or DUT-monitoring circuits may include DUT protection circuits.

Timing components 366 may include various clocks, oscillators, phase-locked loops (PLL), as well as other timing components. Such timing components 366 may provide the timing signal (i.e. heartbeat) for various RTU 350 components, as well as one or more DUTs.

Onboard storage components 368 may include various non-transitory volatile and/or non-volatile computer-readable storage media. Such non-transitory storage media include, but is not otherwise limited to FLASH, EEPROM, DRAM, SDRAM, SRAM, and the like. Such storage media may be employed to store test instructions, test signals, test data, and the like. In various embodiments, test data may be buffered via onboard storage components 368.

Controller components 370 may include one or more logic devices. Thus, controller components 370 may include one or more microcontrollers, microprocessors, central processing units (CPU) (with or without onboard CACHE), field programmable gate arrays (FPGAs), application specific integrated circuits (ASICs), systems on a chip (SOC), and the like. One or more of the controller components 370 may execute test instructions stored via the onboard storage components 368 to control and monitor the various functionalities of RTU 350. The various controller components 370 may be employed to perform various test data encoding, conversions, and/or buffering. In some embodiments, controller components 370 may be employed to perform various onboard test data processing, analyzing, logging, and/or transmitting. Controller components 370 may control and/or monitor the telemetry and self-protection components 364. Although not shown in FIG. 3A, controller components 370 may include various graphic processing unit devices (GPUs) and/or various digital signal processing (DSP) devices.

Display components 372 may include various light-emitting diodes (LEDs), display devices, and the like that can be employed to visually monitor the status of the operation of RTU 350. The display devices may be touch-sensitive so that the user may control the operation of RTU 350 via the touch-sensitive display device.

SGD module 380 may include a various power circuitry components 382, various signal conditioning components 384, and various signal conversion components 386. Power circuitry components 382 may include isolated power devices, such as but not limited to various monolithic and hybrid components. The isolated power devices may include switchers, controllers with field-effect transistors (FETs). Power circuitry components 383 voltage regulators, such as low-dropout DC regulators and other linear voltage regulators.

Signal conditioning components 384 may include level shifting components, impedance matching components, signal termination components, reference signal components, and the like. Signal conversion components 386 may include various digital-to-analog conversion (DAC) components and analog-to-digital (ADC) components.

Figure 3B:
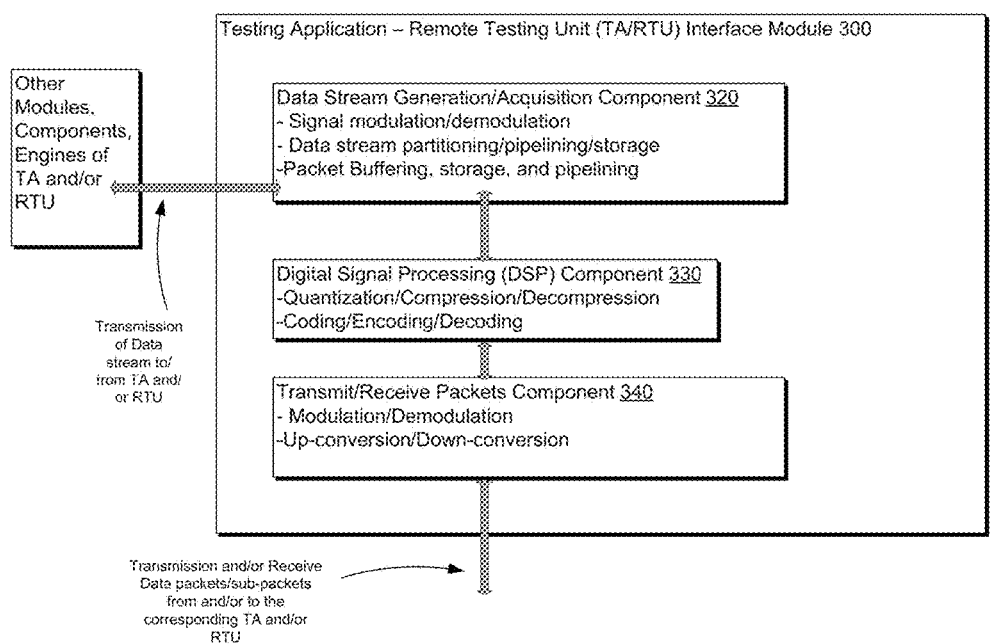
FIG. 3B schematically illustrates an exemplary embodiment of a testing supplication—remote testing unit interface module that is consistent with the various embodiments presented herein.

FIG. 3B schematically illustrates an exemplary embodiment of a testing application—remote testing unit (TA/RTU) interface module 300 that is consistent with the various embodiments presented herein. Various embodiments of TA/RTU interface module 300 may be included in various testing applications and/or remote testing units, such as but not limited to TA 220 of FIG. 2, RTU 250 of FIG. 2, or RTU 350 of FIG. 3A.

TA/RTU interface module 300 includes a data stream generation/acquisition component 320 that receives and/or acquires the data stream from the other modules, components, engines, and the like from the corresponding TA or RTU. For instance component 320 may receive waveforms. Component 320 may modulate (i.e. sample) and/or demodulate (i.e. de-sample) the waveforms from/to a graphic waveform to/from a parameterized and/or sampled waveform to encode in the data stream. In various embodiments, components 320 partitions, pipelines, and/or stores the test data packets and provides the packets to the digital-signal processing (DSP) components 330. The size of these packets may vary with the RTU and/or TA features (i.e. speed of performance, sampling rate, etc.) and the signal complexity.

DSP component 330 may partition, pipeline, and/or store the packets into sub-packets for and in a DSP pipeline. The size of the sub-packets may be dynamic and vary with the signal complexity and in-line with its processing transmission. Various DSP algorithms may be employed to encode/decode a data packet and/or a data sub-packet. The employed algorithms may be automatically selected via in-line signal processing. That is to say, the data packets may be quantized, compressed, and/or decompressed for reduction in the amount of data packets to be transmitted to/from the TA and/or the RTU. DSP component 330 may code, encode, and/or decode the data packets/sub-packets for security and/or fault tolerance purposes. DSP component 330 may buffer, store, and/or pipeline the transmission of the packets/sub-packets for optimized trade-offs between performance in speed and memory/storage.

Transmit/receive packets component 340 may transmit and/or receive the data packets/sub-packets from and/or to the corresponding TA and/or RTU. Component 340 may include software and/or hardware-based middleware, such as but not limited to WiFi-to-USB-C adapters, and the like. Such middleware may be integrated with the TA and/or RTU. Such middleware can be implemented via single-port (serial and/or parallel ports), multi-ports (operating singularly, in sequence, and/or in pipeline mode) to enable communication with a single and/or multiple TAs and/or RTUs. The data packets/sub-packets may be modulated, demodulated, up-converted, down-converted and the like. In various embodiments, the packets/sub-packets may be processed via a power amplifier, low-noise amplifier, or the like.

Generalized Processes for Testing a Remote Device

Processes 400-640 of FIGS. 4-6B will now be discussed. Briefly, processes 400-600 may be employed to probe and/or sense one or more DUTs, sensors, and/or detectors by employing one or more TAs, such as but not limited to TA 220 of FIG. 2 and one or more RTUs, such as but not limited to TA 250 of FIG. 2 and TA 350 of FIG. 3A.

Figure 4:
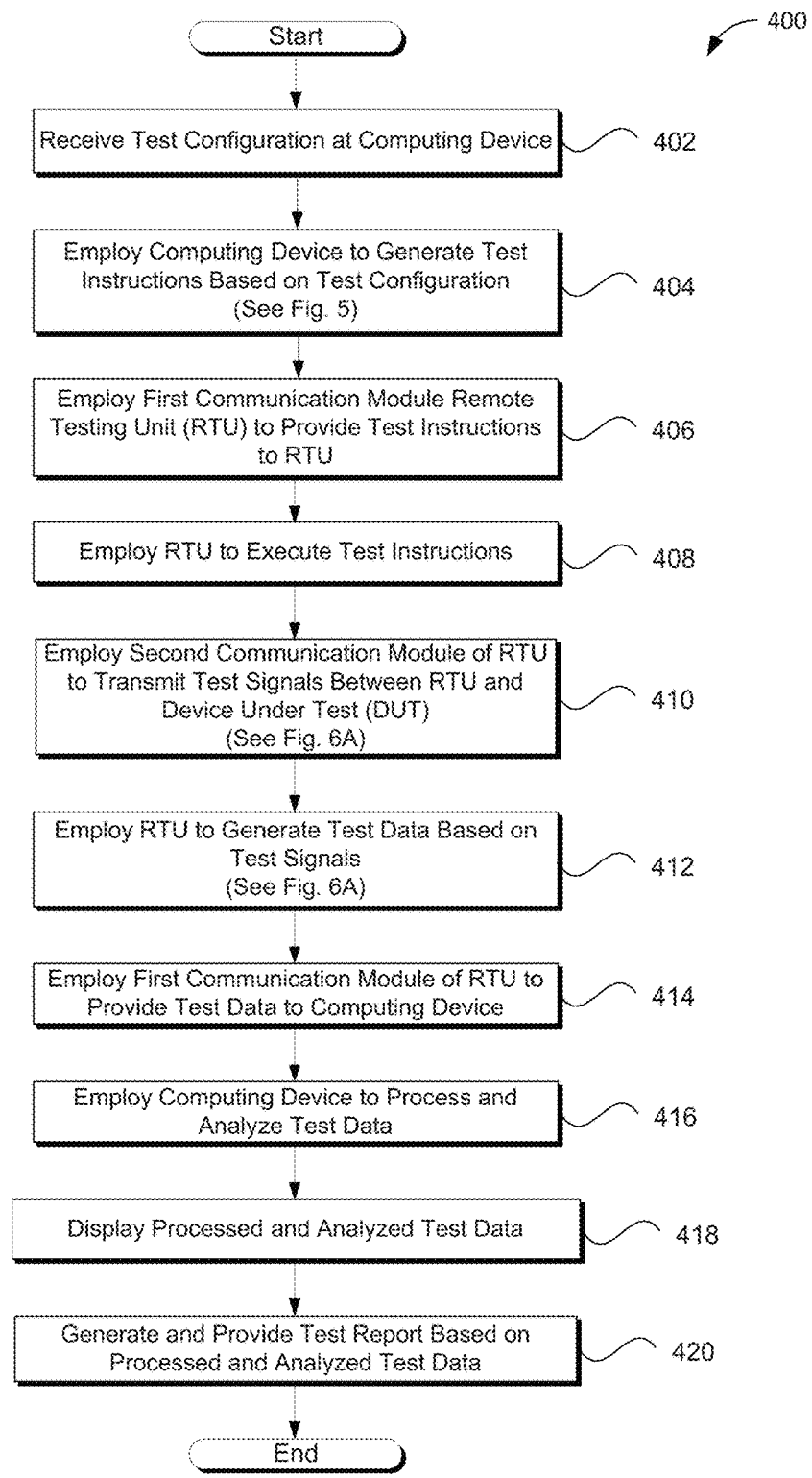
FIG. 4 illustrates one non-limiting embodiment of a process flow for testing a remote device (i.e. the DUT) that is consistent with the various embodiments presented herein.

FIG. 4 illustrates one non-limiting embodiment of a process flow for testing a remote device (i.e. the DUT) that is consistent with the various embodiments presented herein. Process 400 begins, after a start block, at block 402 where a test configuration is received at a computing-device, such as but not limited to user-computing device 202 of FIG. 2. The computing device may host, execute, or otherwise access the functionalities of a testing application (TA), such as but not limited to TA 220 of FIG. 2. For instance, a user may employ one or more UIs of a TA to provide the test configuration. In at least one embodiment, a user provides a test configuration via test scripts, test code, or the like.

At block 404, the computing device is employed to generate test instructions based on the test configuration. In at least one embodiment, a testing engine of the TA, such as but not limited to testing engine 230 of FIG. 2, is enabled to generate machine-executable (and/or computer-executable) test instructions based on the test configuration. For instance, the testing engine may be enabled to generate test scripts and/or test code from the test configuration. In some embodiments, the testing engine includes and/or employs the services of one or more compilers to generate machine-executable test instructions based on the test configuration, test scripts, test code, or the like. Other various embodiments for generating test instructions based on test configurations are described in conjunction with process 500 of FIG. 5.

At block 406, a first communication module of a remote testing unit (RTU) is employed to provide the test instructions from the computing device to the RTU. In some embodiments, a communication network is additionally employed to provide the test instructions to the RTU. For instance, communication network 210 of FIG. 2 and communication module A 352 of FIG. 3A may be employed to provide the test instructions to RTU 350. The test instructions may be at least temporally stored via one or more onboard storage components 370.

At block 408, the RTU is employed to execute the test instructions. For instance, one or more controller components 370 may be employed to execute the testing instructions. In at least one embodiment, the test instructions are employed to configure, reconfigure, program, and/or reprogram a field programmable gate array (FPGA), system on a chip (SOC), or the like. The configured and/or programmed FPGA, SOC, or the like executes the test instructions. In other embodiments, a microprocessor, microcontroller, central processing unit (CPU), or other logic component of the controller components 370 is employed to execute the test instructions. In various embodiments, executing the test instructions enables the RTU to generate one or more outgoing test signals.

At block 410, a second communication module of the RTU is employed to transmit test signals between the RTU and the DUT. Various embodiments of employing a second communication module of the RTU to transmit test signals between the RTU and the DUT are discussed in conjunction with at least process 600 of FIG. 6A. However, briefly, communication module B 354 of RTU 350 may be employed to provide the outgoing test signals to the DUT. In response to the provided outgoing test signals, the DUT may generate one or more output signals. These DUT outputted test signals may be provided to the RTU, as incoming test signals via the second communication module of the RTU. In various embodiments, the first communication module of the RTU may be a "slow communication module" relative to the second communication module of the RTU. Accordingly, the second communication module of the RTU may be a "fast communication module" relative to the first communication module. At least a portion of the incoming test signals may be at least temporarily stored and/or buffered via onboard storage components 368.

At block 412, the RTU is employed to generate test data based on the transmitted test signals. Various embodiments for generating test data based on test signals are discussed in conjunction with at least process 600 of FIG. 6A. However, briefly here, controller components 370 may be employed to generate test data based on the test signals. The test data may be at least temporally stored in onboard storage components 368. In some embodiments, the test data is temporarily buffered via onboard storage components 368.

At block 414, the first communication module of the RTU is employed to provide at least a portion of the test data to the user computer. At block 416, the computer device is employed to process and/or analyze the test data. Briefly, an analysis engine of the TA, such as but not limited to analysis engine 222 of FIG. 2, may be enabled to process and analyze the test data.

At block 418, at least a portion of the processed and/or analyzed test data may be displayed. For instance, a UI engine of the TA, such as but not limited to UI engine 240 of FIG. 2, may generate one or more UIs that emulate various output displays of testing equipment, such as but not limited to oscilloscopes, logic analyzers, waveform/pulse generators, multimeters, and the like. Such UIs may be employed to display the test data. For example, UI display 242 of FIG. 2 is shown displaying test data similar to traditional oscilloscope test data. Similarly, UI 244 is shown displaying test data similar to traditional logic analyzer test data.

At block 420, one or more test reports based on the processed and analyzed test data may be generated and provided. For instance, the test report may be generated and provided to one or more users. In at least one embodiment, a test report is stored via data storage 212 of FIG. 2. Process 400 may terminate and/or return a calling process.

Figure 5:
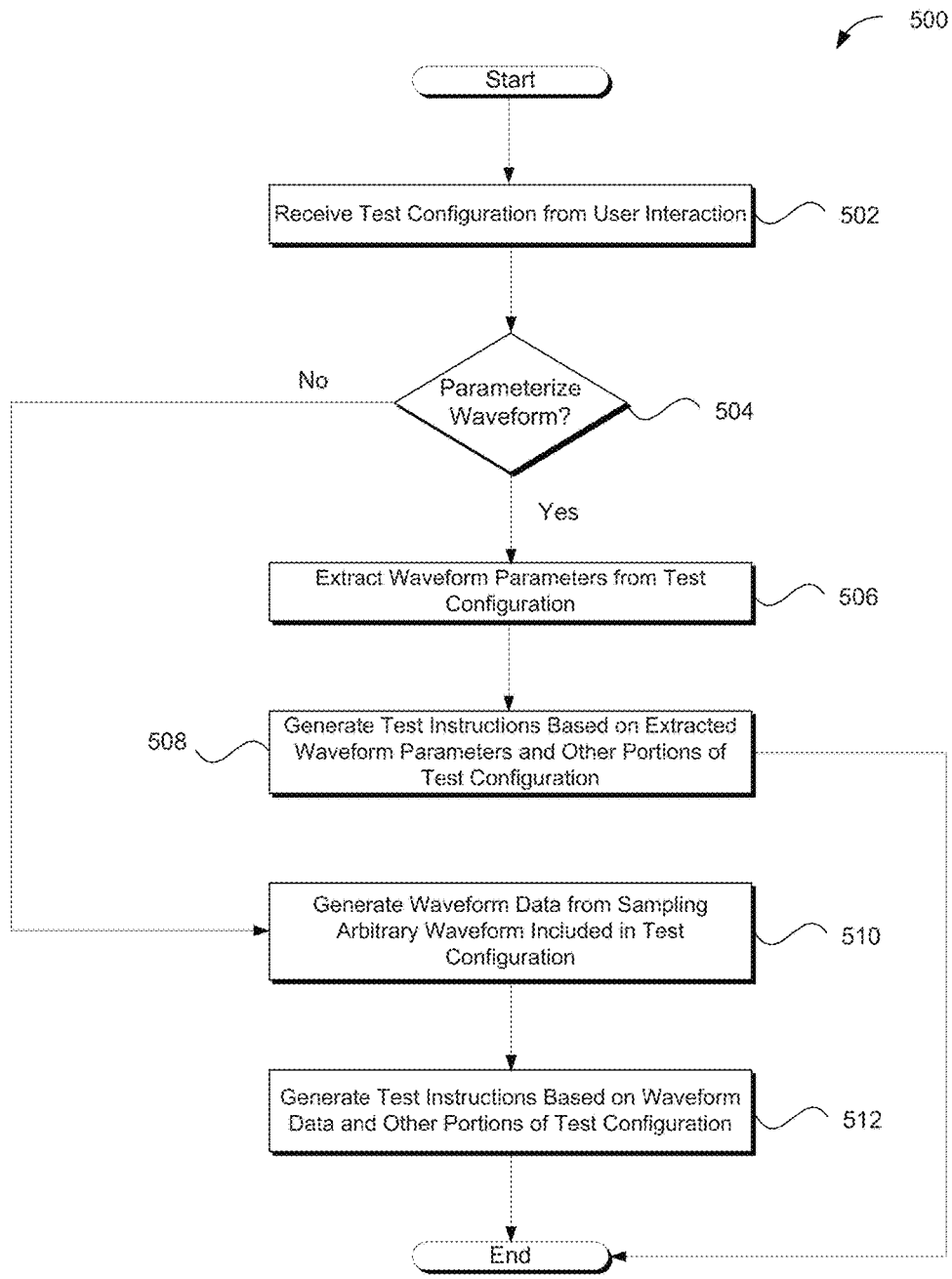
FIG. 5 illustrates one non-limiting embodiment of a process flow for generating test instructions that is consistent with the various embodiments presented herein.

FIG. 5 illustrates one non-limiting embodiment of a process flow for generating test instructions that is consistent with the various embodiments presented herein. Process 500 begins, after a start block, at block 502 where a test configuration is received via one or more user interactions. For instance, a user may employ an input UI of a TA to provide user interactions that generate the test configuration.

At decision block, it is determined whether to parameterize one or more waveforms included in the test configuration. In various embodiments, a waveform and/or pulse will be parameterized when the amount of information required to parameterize the waveform/pulse is less than the amount of information required to adequately encode the waveform via sampling techniques. If the waveform and/or pulse is not be to be parameterized, process 500 flows to block 510. Otherwise, process 500 flows to block 506.

At block 506, the waveform parameters are extracted and/or determined from and/or based on the test configuration. Such waveform parameters include, but are not otherwise limited to a discrete and/or continuous frequency spectrum, sets of orthonormal basis functions and expansion coefficients, coefficients encoding one or more amplitudes, frequencies, or the like, or any other means of encoding a waveform and/or a pulse. A TA/RTU interface module, such as but not limited to TA/RTU interface modules 232 of FIG. 2, TA/RTU interface module 258 of FIG. 2, or TA/RTU interface module 300 of FIG. 3B may be employed to extract waveform parameters.

At block 508, the test instructions are generated based on the extracted waveform parameters and other portions of test configuration. Process 500 may terminate and/or return a calling process. Various Digital Signal Processing (DSP) techniques and algorithms based on quantization, compression, decompression, encoding. decoding, etc. can be employed at block 508 to reduce the sample size of trans fitted data between the TA and RTU and vice-versa. Such DSP algorithms are discussed in conjunction with at least FIG. 3B. Each of these steps may be preceded by a signal recognition step that allows the localization of the signal main characteristics such as the signal-bandwidth, amplitudes, shape, and the like. For instance, envelope detection techniques may be employed to minimize time for data extraction and tune in on the right frequencies in much shorter times. The selected solution will select the adequate sampling-rate, the memory buffer size and other needed signal-parameters. The more random and/or arbitrary the signal, the higher is the required sampling rate of the transmitted signal (compressed data-stream) as well as the buffer memory size. The resulting performance is a trade-off between buffer memory size, the required sampling rate and the randomness or complexity of the signal.

When the waveform is not parameterized, the waveform and/or pulse may be encoded in the test instructions via sampling the waveform included in the test configuration. The samples may be encoded in the test instructions. For example, a UI of the TA may enable a user to provide any arbitrary waveform and/or pulse when providing the test configuration. At block 510, the arbitrary waveform and/or pulse included in the test configuration may be sampled to generate waveform data. At block 512, the test instructions are generated based on the waveform data and other portions of the test configuration. Process 500 may terminate and/or return a calling process. The waveform can be drawn manually by the user and reconfigured automatically by the TA to the closest waveform-shape.

Figure 6A:
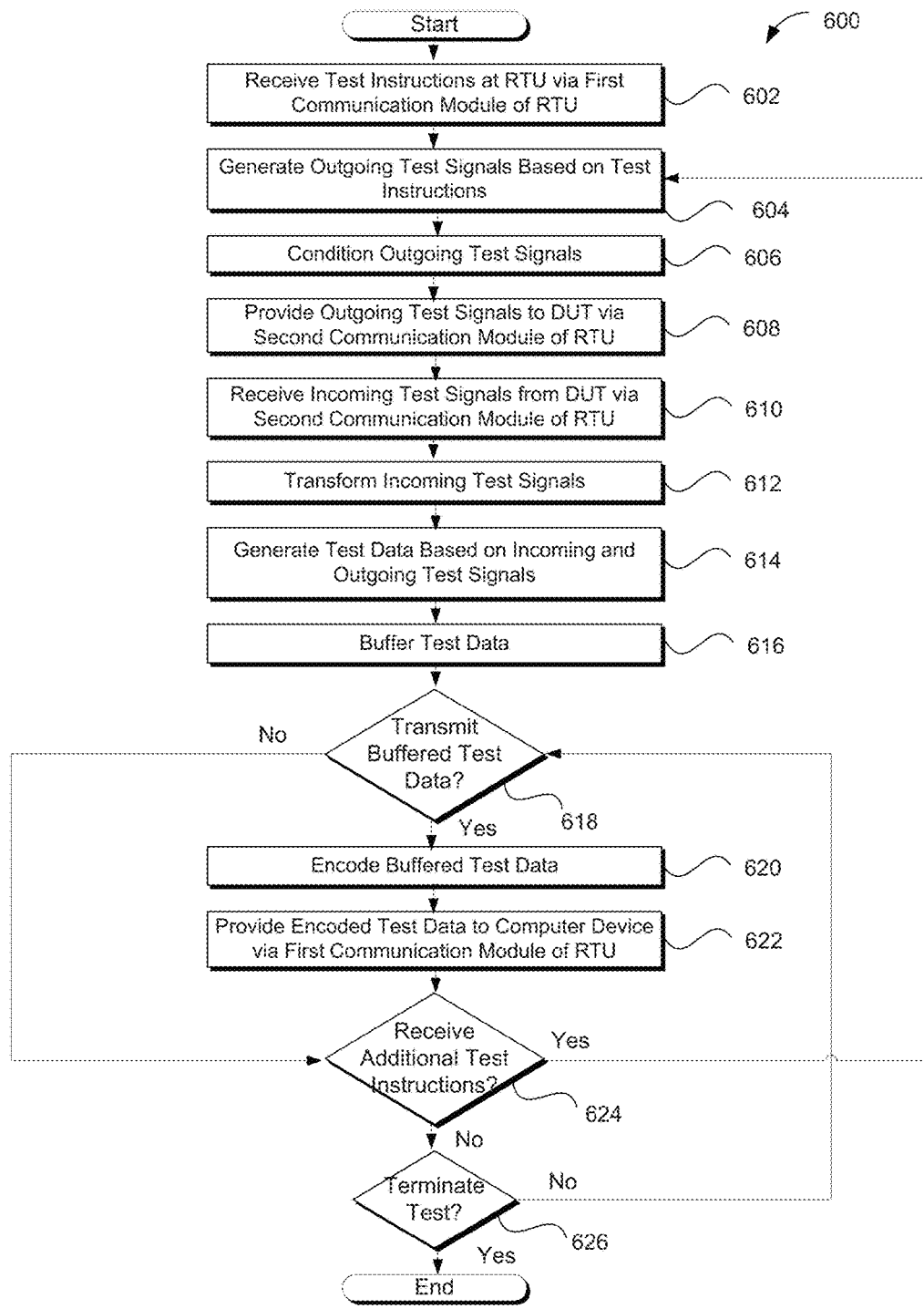
FIG. 6A illustrates one non-limiting embodiment of a process flow for providing test signals to a remote device that is consistent with the various embodiments presented herein.

FIG. 6A illustrates one non-limiting embodiment of a process flow for providing test signals to a remote device that is consistent with the various embodiments presented herein. At block 602, test instructions are received at the RTU via a first communication module of the RTU, such as but not limited to communication module A 352 of FIG. 3A.

At block 604, outgoing test signals are generated based on the test instructions. For instance, one or more controller components 370 of FIG. 3A may provide one or more control signals to signal generation and detection (SGD) module 380. In response to such control signals, SGD module 280 may generate outgoing test signals. More particularly, power signal components 382 and/or signal conversion components 386 may generate and/or convert outgoing test signals. For instance, a digital-to-analog (DAC) component may generate an outgoing analog test signal based on a digital signal generated based on the test instructions.

At block 606, the outgoing test signal may be shaped and/or conditioned. For instance, signal-conditioning components 382 may be employed to shape and/or condition the outgoing test signals. At block 608, the outgoing test signals may be provided to the DUT via the second communication module of the RTU. For instance, the outgoing test signals may be provided and/or transmitted to the DUT via communication module B 354 of FIG. 3A.

In some embodiments that are employed as a prober (e.g. a logic analyzer, a pulse and/or waveform generator, and the like), the outgoing test signals may include a pulse and/or a waveform. For instance, the sampled and/or parameterized waveform discussed in conjunction with at least process 500 of FIG. 5 may be included in the provided outgoing test signals.

In other embodiments that are employed only as a sensor or a prober (e.g. an oscilloscope, a multimeter, and the like), outgoing test data may not be generated and provided to the DUT. For instance, when operating as an oscilloscope, the RTU may not provide outgoing test signals, but may still receive incoming test signals, as discussed in conjunction with at least block 610.

At block 610, incoming test signals are received from the DUT via the second communication module of the RTU. For instance, in response to the provided outgoing test signals, the DUT may generate various output test signals. Such output test signals may be received at block 610 as incoming test signals via the second communication module of the RTU. In some embodiments, the incoming test signals may be generated in response to conditions other than the outgoing test signals. For instance, when operating as a sensor or a prober, such as an oscilloscope, one or more waveforms may be received as encoded in the incoming test signals. Such waveforms may be generated by the DUT in response to signals other than test signals provided to the DUT by the RTU.

At block 612, the incoming test signals may be transformed. In some embodiments, signal conversion components 386 may be employed to transform the incoming test signals. For instance, at least a portion of the incoming test signals may include analog signals. An analog-to-digital (ADC) may be employed to convert the incoming analog test signal to a digital test signal. Thus, the test signals may be digitized at block 612. In some embodiments, one or more signal conditioning components, such as but not limited to signal conditioning components 384, may be employed to transform the test signals at block 612. For instance, level shifters may be employed to adjust the amplitude of the digitized test signal, to impedance match an incoming and/or an outgoing test signal.

At block 614, test data is generated based on the incoming and outgoing test signals. For instance, at least a portion of the incoming and/or outgoing test signals may be encoded in test data. Thus, test data may encode at least a portion of the incoming and/or outgoing test signals. A portion of the test signals may be encoded via parameters that encode the test signals. Another portion of the test signals may be encoded via waveform data generated from sampling the test signals. At block 616, the test data may be buffered and/or stored via onboard storage components 368.

At decision block 618, it is determined whether to transmit at least a portion of the buffered test data. If the test data is to be transmitted, process 600 flows to block 620. Otherwise, process 600 flows to decision block 624.

At block 620, the test data may be encoded. At block 622, the encoded test data is provided to a computer device via the first communication module of the RTU. At decision block 624, it is determined whether additional test instructions are received at the RTU via the first communication module. If additional test instructions are received at the RTU, process 600 returns to block 604 to generate additional outgoing test signals. Otherwise, process 600 flows to decision block 626. At decision block 626, it is decided whether to terminate the test. If the test is not terminated, process 600 may return to decision block 618 to determine whether to transmit additional test data. If the test is to be terminated, process 600 may terminate and/or return a calling process.

Figure 6B:
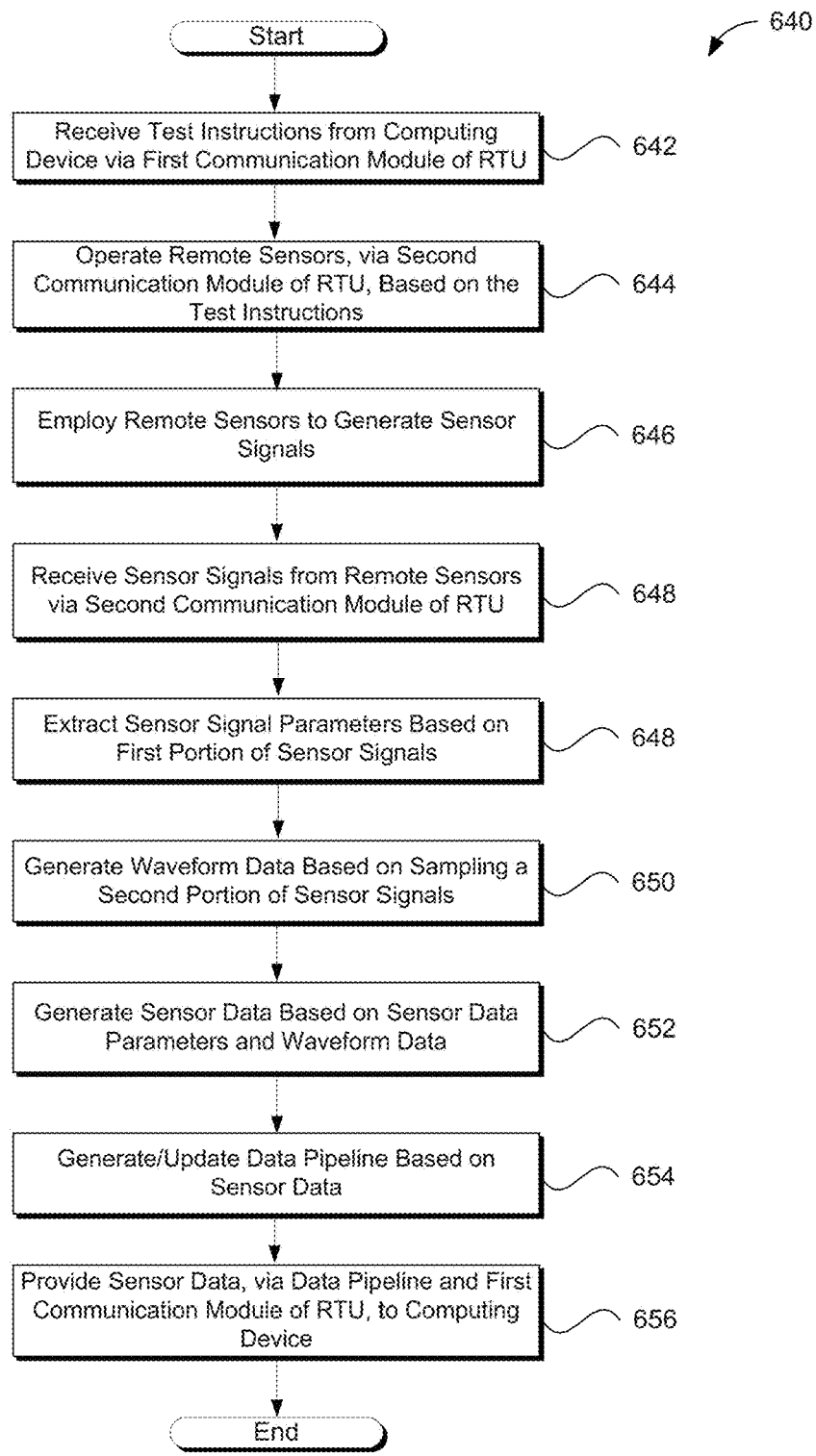
FIG. 6B illustrates one non-limiting embodiment of a process flow for operating remote test sensors that is consistent with the various embodiments presented herein.

FIG. 6B illustrates one non-limiting embodiment of a process flow for operating remote test sensors that is consistent with the various embodiments presented herein. Process 600 begins, after a start block, at block 642, where test instructions are received from a computing device, via a first communication module of the RTU. For instance, the test instructions may be received via a series of TCP/IP data packets by communication module A 352 of FIG. 3A.

At block 644, one or more remote sensors and/or detectors are operated via a second communication module of the RTU. The remote sensors may be operated based on the received test instructions. For instance, controller module 360 of the RTU 350 may execute the test instructions. The execution of the test instructions generates test signals, which are provided to the one or more sensors via communication module B 354. Such sensors include, but are not limited to cameras, LIDAR systems, environmental sensors, and the like. Such provided signals may arm, power-up, or otherwise operate the remote sensors.

At block 646, the remote sensors are employed to generate sensor signals. For instance, a remote camera may generate one or more sensor signals that encodes an image. At block 648, the sensor signals are received at the RTU, via a second communication module of the RTU. For instance, communication module B 354 of RTU 350 may receive the sensors signals encoding the image.

At block 648, one or more sensor signal parameters may be extracted based on a first portion of the sensor signals. For instance, various waveforms and/or pulse encoded in the sensor signals may be readily parameterized via sensor signal parameters. For such readily parameterized waveforms/pulses, the sensor signal parameters may be extracted via controller components 370.

At block 650, waveform data may be generated based on sampling a second portion of the sensor signals. For instance, for waveforms/pulsed included in the sensor signals that are not so readily parameterized (i.e. the number of parameters required to encode the waveform is significant), the waveform may be sampled.

At block 652, sensor data may be generated based on sensor data parameters and/or the waveform data. For instance, sensor data may encode at least portions of the sensor signals. The first portion of the sensor signals may be encoded via the sensor signal parameters and the second portion of the sensor signals may be encoded via the waveform data. Such encoding may decrease the overall communication bandwidth required via the first communication module of the RTU.

At block 654, a data pipeline is generated and/or updated based on the sensor data. At block 656, the sensor data is provided to the computing device, via the data pipeline and the first communication module of the RTU. Process 600 may be terminated and/or return a calling process.

Illustrative Applications of the Various Embodiments

The various embodiments enable telemetry and instrumentation applications. Such applications include cloud-based and/or mobile device-based replacements for test, measurement and instrumentation equipment, including but not limited to logic analyzers, device analyzers, multimeters, oscilloscopes, waveform/pulse-generators, circuit-testers, and the like that are employed to probe, sense or generate analog and/or digital signals. A testing application (TA) may be employed to graphically view, monitor, log, and analyze test data, similarly to the above mentioned test equipment, without requiring the actual test equipment. The TA may be a mobile TA. In the various embodiments, the TA may provide control interfaces, similar to the control interfaces of logic analyzers, oscilloscopes and pulse generators. The TA can control the operation of the RTU, which main roles are to generate and receive signals to/from the DUTs.

As noted throughout, external and/or sensors and/or detectors may be operated via the various embodiments. Thus, the various embodiments are enabled to control and acquire data from such remote sensors, such as but not limited to material and gas sensors. Other sensors include cameras and LIDAR systems. LIDAR systems may be remotely controlled to remotely detect food ingredients, determine the food's energy content (i.e. caloric content), detect pollutants, and the like.

Via educational software included in the TA, the various embodiments may be employed as an educational tool. For instance, students may view, generate, sense, control and process electrical or laser pulses, magnetic waves, and the like, via controlling such signal generators connected to the RTU by communication module B.

Various medical devices may be controlled via the embodiments presented herein. Such medical devices may be operated as a prober and/or a sensor to electrically and/or mechanically stimulate portions of human body. An x-ray generator and detector system may be operated to view a certain area of the human body. A stimulator device may be operated to transmit electrical/mechanical stimulating waves for therapeutic healing, and probing the human body response to the waves. For example, a person who has a handicap in his hands (legs) can wear gloves (shoes) that are equipped with sensors and probers, controlled by the TA. The TA may be voice-controlled via text-to-speech services. A voice controlled TA enables the user to contract and use his hands (legs). Some embodiments enable care-givers and nurses to run their massage therapy sessions wirelessly by controlling the gloves (shoes) of a patient in real-time.

The various embodiments may be employed as a communication platform. The communication platform enables communication between a group of users wirelessly. The platform may employ the senses of the users, such as touch, smell and taste. Each of the users may be equipped with an RTU and a TA. The RTU may be connected to sensing and/or probing devices that may detect and sequencing user interactions, reactions and signals to each other, and such. Each of the usual human body senses, will be translated to a set of electrical/magnetic/pressure/thermal pulses or waves that will trigger a reaction in the user. In this case, the sensing and/or probing devices may include a blanket, a jacket, a glove, or any form of a wearable device that is equipped with multiple sensors and probers. Such sensing and/or probing devices may enable each party to touch, hug, shake hands, interact, etc., wirelessly and in real-time.

The various embodiments may be integrated with pre-existing gaming platforms. More specifically, the embodiment may enable prober and/or sensors employed as stimulators to play interactive games that involve touch, physical actions and reactions, etc. The probers, sensors, and/or stimulators may be employed in dance/sport classes or games (tango, box, judo, karate, etc.), where a user may apply pressure to another user to direct him to a certain movement and vice-versa, etc. The user's movements are directed and controlled by the TA(s) and applied or sensed signals/waves or pressures are applied on each of the user's (DUTs) by their wearable devices (RTUs). Multiple remote TAs may control, monitor and share the same RTU(s) in real-time in a synchronized manner. Consequently, a single or multiple individuals can participate in a game and form teams to play jointly or individually.

Some embodiments may be employed as a tourist tool. For instance, a user may be equipped with wearable devices, such as but not limited to haptic glasses, shoes, gloves, etc., and communicating with sensor bases that are located in museums, coffee shops, main tourist attractions. As a result, a user located virtually anywhere on the planet and equipped with the various embodiments may virtually tour (walk in real-time) in a museum or tourist attraction in the world, alone or with his friends and family as long as they are all connected to the internet and the tourist places are equipped with these wireless sensor-bases.

Illustrative Computing Device

Figure 7:
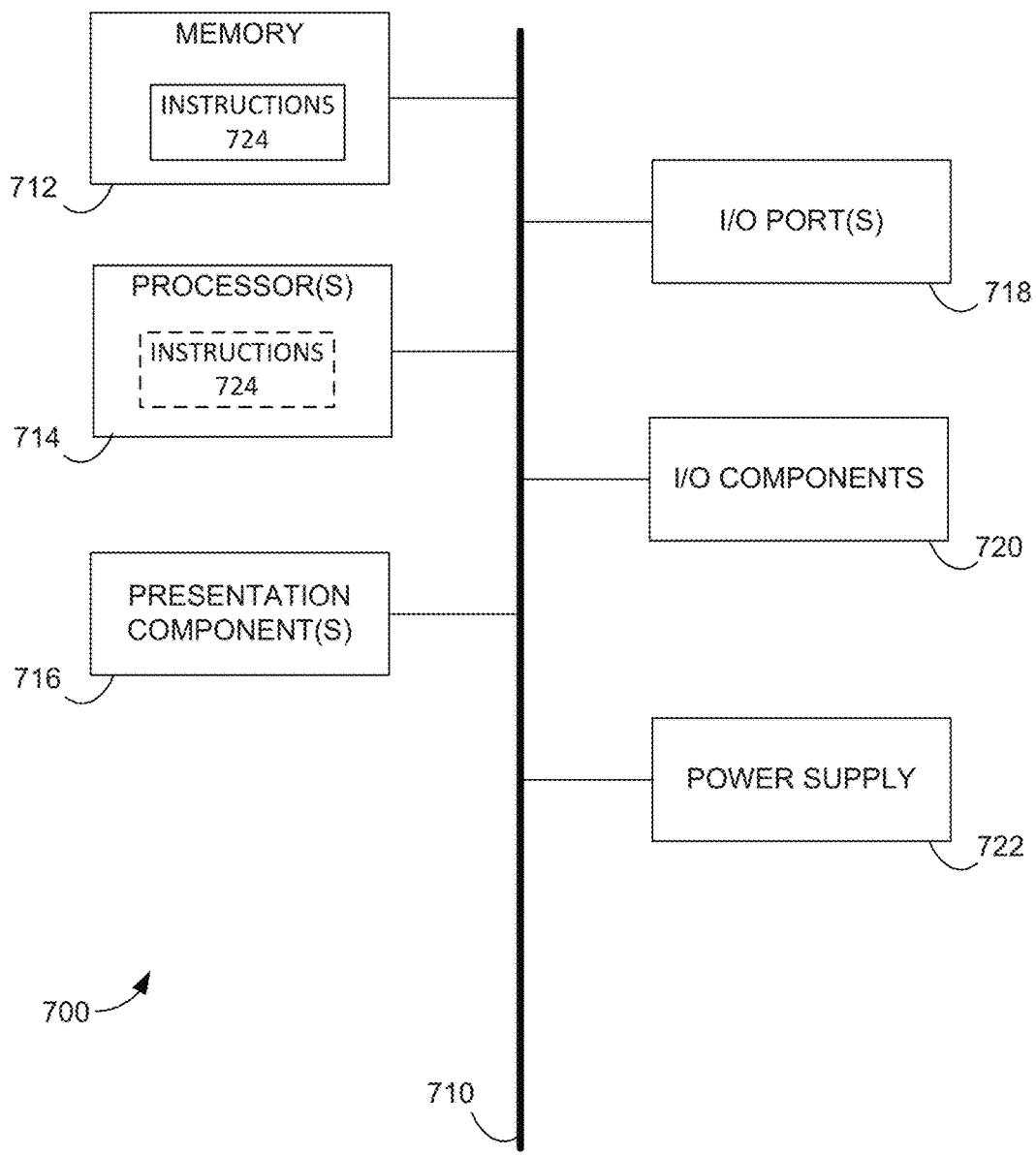
FIG. 7 is a block diagram of an example computing-device in which embodiments of the present disclosure may be employed.

Having described embodiments of the present invention, an example operating environment in which embodiments of the present invention may be implemented, is described below in order to provide a general context for various aspects of the present invention. Referring to FIG. 7, an illustrative operating environment for implementing embodiments of the present invention is shown and designated generally as computing device 700. Computing device 700 is but one example of a suitable computing environment and is not intended to suggest any limitation as to the scope of use or functionality of the invention. Neither should the computing device 700 be interpreted as having any dependency or requirement relating to any one or the combination of components illustrated.

Embodiments of the invention may be described in the general context of computer code or machine-useable instructions, including computer-executable instructions such as program modules, being executed by a computer or other machine, such as a smartphone or other handheld device. Generally, program modules, or engines, including routines, programs, objects, components, data structures, etc., refer to code that perform particular tasks or implement particular abstract data types. Embodiments of the invention may be practiced in a variety of system configurations, including hand-held devices, consumer electronics, general-purpose computers, more specialized computing devices, etc.

Embodiments of the invention may also be practiced in distributed computing environments where tasks are performed by remote-processing devices that are linked through a communications network. Accordingly, computing device 700 may include a communication module that includes similar communication functionalities as communication module A 252 of RTU 250 of FIG. 2 and/or communication module A 352 of RTU 350 of FIG. 2A. More particularly, computing device 700 may be configured to communicatively coupled to other computing devices and/or a communication module A of an RTU, via various WiFi communication components, Bluetooth communication components, cellular communication components, Zigbee communication components, ethernet communication components, optical communication components, USB communication components, internet protocols, RF communication components, microwave communication components and other communication components. Communication components included in the communication module of computing devices may enable the communicative coupling of computing device 700 over wireless bands, such as RF bands, microwave bands, and the like.

With reference to FIG. 7, computing device 700 includes a bus 710 that directly or indirectly couples the following devices: memory 712, one or more processors 714, one or more presentation components 716, input/output ports 718, input/output components 720, and an illustrative power supply 722. Bus 710 represents what may be one or more busses (such as an address bus, data bus, or combination thereof). Although the various blocks of FIG. 7 are shown with clearly delineated lines for the sake of clarity, in reality, such delineations are not so clear and these lines may overlap. For example, one may consider a presentation component such as a display device to be an I/O component, as well. Also, processors generally have memory in the form of cache. We recognize that such is the nature of the art, and reiterate that the diagram of FIG. 7 is merely illustrative of an example computing device that can be used in connection with one or more embodiments of the present disclosure. Distinction is not made between such categories as "workstation," "server," "laptop," "hand-held device," etc., as all are contemplated within the scope of FIG. 7 and reference to "computing device."

Computing device 700 typically includes a variety of computer-readable media. Computer-readable media can be any available media that can be accessed by computing device 700 and includes both volatile and nonvolatile media, removable and non-removable media. By way of example, and not limitation, computer-readable media may comprise computer storage media and communication media.

Computer storage media include volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 700. Computer storage media excludes signals per se.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, video and other wireless media. Combinations of any of the above should also be included within the scope of computer-readable media. Multiple TAs may transmit data between one another, as well as multiple RTUs via hardware-based and/or software based middleware. Various embodiments may include sleep and/or standby modes to manage the power consumption of an RTU. That is, an RTU and/or a TA may only be operational only when sensing signals to transmit or receive to/from the DUT. Sensors can also be added at the end of the Communication Module B to detect proximity or electrical contact with the DUT.

Memory 712 includes computer storage media in the form of volatile and/or nonvolatile memory. Memory 712 may be non-transitory memory. As depicted, memory 712 includes instructions 724. Instructions 724, when executed by processor(s) 714 are configured to cause the computing device to perform any of the operations described herein, in reference to the above-discussed figures, or to implement any program modules described herein. The memory may be removable, non-removable, or a combination thereof. Illustrative hardware devices include solid-state memory, hard drives, optical-disc drives, etc. Computing device 700 includes one or more processors that read data from various entities such as memory 712 or I/O components 720. Presentation component(s) 716 present data indications to a user or other device. Illustrative presentation components include a display device, speaker, printing component, vibrating component, etc.

I/O ports 718 allow computing device 700 to be logically coupled to other devices including I/O components 720, some of which may be built in. Illustrative components include a microphone, joystick, game pad, satellite dish, scanner, printer, wireless device, etc.

Embodiments presented herein have been described in relation to particular embodiments, which are intended in all respects to be illustrative rather than restrictive. Alternative embodiments will become apparent to those of ordinary skill in the art to which the present disclosure pertains without departing from its scope.

From the foregoing, it will be seen that this disclosure in one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

In the preceding detailed description, reference is made to the accompanying drawings, which form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the preceding detailed description is not to be taken in a limiting sense, and the scope of embodiments is defined by the appended claims and their equivalents.

Various aspects of the illustrative embodiments have been described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features have been omitted or simplified in order not to obscure the illustrative embodiments.

Various operations have been described as multiple discrete operations, in turn, in a manner that is most helpful in understanding the illustrative embodiments; however, the order of description should not be construed as to imply that these operations are necessarily order dependent. In particular, these operations need not be performed in the order of presentation. Further, descriptions of operations as separate operations should not be construed as requiring that the operations be necessarily performed independently and/or by separate entities. Descriptions of entities and/or modules as separate modules should likewise not be construed as requiring that the modules be separate and/or perform separate operations. In various embodiments, illustrated and/or described operations, entities, data, and/or modules may be merged, broken into further sub-parts, and/or omitted.

The phrase "in one embodiment" or "in an embodiment" is used repeatedly. The phrase generally does not refer to the same embodiment; however, it may. The terms "comprising," "having," and "including" are synonymous, unless the context dictates otherwise. The phrase "A/B" means "A or B." The phrase "A and/or B" means "(A), (B), or (A and B)." The phrase "at least one of A, B and C" means "(A), (B), (C), (A and B), (A and C), (B and C) or (A, B and C)."

What is claimed is:

1. A computer-readable non-transitory storage medium having instructions stored thereon for sensing a device-under-test (DUT), which, when executed by a processor of a user-computing device cause the user-computing device to perform actions comprising:

receiving a test configuration that includes a waveform;

parameterizing a first portion of the waveform with a set of frequency domain parameters based on a first amount of information required to parameterize the first portion of the waveform with the set of frequency domain parameters and a second amount of information required to digitize the first portion of the waveform with a set of samples of the first portion of the waveform, wherein the first amount of information is less than the second amount of information;

digitizing a second portion of the waveform with a set of samples of the second portion of the waveform based on a third amount of information required to parameterize the second portion of the waveform with another set of frequency domain parameters and a fourth amount of information required to digitize the second portion of the waveform with the set of samples of the second portion of the waveform, wherein the third amount of information is greater than the fourth amount of information;

encoding the waveform, wherein the first portion of the waveform is encoded with the set of frequency domain parameters and the second portion of the waveform is encoded with the set of samples of the second portion of the waveform;

generating test instructions based on the received test configuration, wherein the test instructions include the set of frequency domain parameters and the set of samples of the second portion of the waveform;

providing the test instructions to a first communication module of a remote testing unit (RTU) by employing a communication network;

employing one or more logic devices of the RTU to execute the test instructions, wherein executing the test instructions includes generating the first portion of the waveform based on the set of frequency parameters, generating the second portion of the waveform based on the set of samples of the second portion of the waveform, and employing a second communication module of the RTU, which is communicatively coupled to the DUT, to provide the generated first and second portions of the waveform to the DUT;

in response to executing the test instructions, employing the second communication module of the RTU to receive one or more incoming test signals that are generated by the DUT in response to receiving the provided first and second portions of the waveform;

employing the one or more logic devices of the RTU to generate test data based on the one or more incoming test signals; and receiving from the first communication module of the RTU and the communication network the test data.

2. The computer-readable storage medium of claim 1, wherein the actions further comprise:

in response to executing the test instructions, employing a signal generation and detection (SGD) module of the RTU to generate one or more outgoing test signals;

employing the second communication module of the RTU to provide the one or more outgoing test signals to the DUT, wherein the one or more outgoing test signals includes the first and second portions of the waveform;

employing the second communication module of the RTU to receive one or more incoming test signals generated by the DUT, wherein the one or more incoming test signals are in response to the provided one or more outgoing test signals; and employing the one or more logic devices of the RTU to generate the test data, wherein the test data encodes each of the one or more outgoing test signals and the one or more incoming test signals.

3. The computer-readable storage medium of claim 2, wherein the actions further comprise:

employing one or more signal conditioning components of the SGD module to condition the one or more outgoing test signals;

employing the second communication module of the RTU to provide the one or more conditioned outgoing test signals to the DUT; and employing the one or more signal conditioning components of the SGD module to condition the one or more incoming test signals.

4. The computer-readable storage medium of claim 1, wherein the actions further comprise:

employing the one or more logic devices of the RTU to generate one or more signal parameters based on a first portion the one or more incoming test signals, wherein the one or more signal parameters includes a second set of frequency domain parameters;

employing one or more signal conversion components of the RTU to generate a second set of waveform samples based on sampling a second portion of the one or more incoming test signals; and employing the one or more logic devices of the RTU to generate the test data, wherein the test data includes the one or more signal parameters and the second set of waveform samples.

5. The computer-readable storage medium of claim 1, wherein the first communication module of the RTU employs an internet protocol suite to provide the test data to the user-computing device and the second communication module of the RTU includes one or more components that convert the incoming test signals between a serial encoding and a parallel encoding.

6. The computer-readable storage medium of claim 1, wherein the actions further comprise:

enabling a user to employ the user-computing device to manually draw the waveform.

7. The computer-readable storage medium of claim 1, wherein the DUT is an operational amplifier (Op-amp), the one or more incoming test signals include an output signal of the op-amp, and the actions further comprise:

employing the one or more logic devices of the RTU to encode the output signal of the op-amp in the test data; and generating a report that includes at least a visualization of the output signal of the op-amp based on the test data encoding the output signal of the op-amp.

8. A method for sensing a device-under-test (DUT) comprising:

receiving a test configuration that includes a waveform;

parameterizing a first portion of the waveform with a set of frequency domain parameters based on a first amount of information required to parameterize the first portion of the waveform with the set of frequency domain parameters and a second amount of information required to digitize the first portion of the waveform with a set of samples of the first portion of the waveform, wherein the first amount of information is less than the second amount of information;

digitizing a second portion of the waveform with a set of samples of the second portion of the waveform based on a third amount of information required to parameterize the second portion of the waveform with another set of frequency domain parameters and a fourth amount of information required to digitize the second portion of the waveform with the set of samples of the second portion of the waveform, wherein the third amount of information is greater than the fourth amount of information;

encoding the waveform, wherein the first portion of the waveform is encoded with the set of frequency domain parameters and the second portion of the waveform is encoded with the set of samples of the second portion of the waveform;

generating, by a user-computing device, test instructions based on the received test configuration, wherein the test instructions include the set of frequency domain parameters and the set of samples of the second portion of the waveform;

providing, by a communication network, the test instructions to a first communication module of the remote testing unit (RTU);

executing, by one or more logic devices of the RTU, the test instructions, wherein executing the test instructions includes generating the first portion of the waveform based on the set of frequency parameters, generating the second portion of the waveform based on the set of samples of the second portion of the waveform, and employing a second communication module of the RTU, which is communicatively coupled to the DUT, to provide the generated first and second portions of the waveform to the DUT;

in response to executing the test instructions, receiving, at the second communication module of the RTU, one or more incoming test signals that are generated by the DUT in response to receiving the provided first and second portions of the waveform;

generating, by the one or more logic devices of the RTU, test data based on the one or more incoming test signals; and providing, by the communication network, the test data from the first communication module of the RTU to the user-computing device.

9. The method of claim 8, further comprising:

in response to executing the test instructions, generating, by a signal generation and detection (SGD) module of the RTU, one or more outgoing test signals;

providing, by the second communication module of the RTU, the one or more outgoing test signals to the DUT, wherein the one or more outgoing test signals includes the first and second portions of the waveform;

receiving, by the second communication module of the RTU, one or more incoming test signals generated by the DUT, wherein the one or more incoming test signals are in response to the provided one or more outgoing test signals; and employing the one or more logic devices of the RTU to generate the test data, wherein the test data encodes each of the one or more outgoing test signals.

10. The method of claim 9, further comprising:

conditioning, by the one or more signal conditioning components of the SGD module, the one or more outgoing test signals;

providing, by the second communication module of the RTU, the one or more conditioned outgoing test signals to the DUT; and conditioning, by the one or more signal conditioning components of the SGD module, the one or more incoming test signals.

11. The method of claim 8, further comprising:

generating, by the one or more logic devices of the RTU, one or more signal parameters based on a first portion the one or more incoming test signals, wherein the one or more signal parameters includes a second set of frequency domain parameters;

generate, by one or more signal conversion components of the RTU a second set of waveform samples based on sampling, a second portion of the one or more incoming test signals; and generating, by the one or more logic devices of the RTU, the test data, wherein the test data include the one or more signal parameters and the second set of waveform samples.

12. The method of claim 8, wherein the first communication module of the RTU employs an internet protocol suite to provide the test data to the user-computing device and the second communication module of the RTU includes one or more components that convert the incoming test signals between a serial encoding and a parallel encoding.

13. The method of claim 8, further comprising enabling a user of the user-computing device to manually draw the waveform.

14. The method of claim 8, wherein the DUT is another logic device, the one or more incoming test signals include an output signal of the other logic device, and the method further comprising:

encoding, by the one or more logic devices of the RTU, the output signal of the logic-device in the test data;

generating, by the user-computing device, a test report that includes at least a visualization of the output signal of the other logic device encoded in the test data; and employing the user-computing device to provide a display, to a user, of the visualization of the output signal of the other logic device that is included in the test report.

15. A system for sensing a device-under-test (DUT), the system comprising:

a remote testing unit (RTU) that includes:
 a first communication module;
 a second communication module that is communicatively coupled to the DUT; and
 one or more logic devices;

a communication network; and a user-computing device that includes a display device and is communicatively coupled to the first communication module of the RTU via the communication network and enabled to perform actions including:

receiving a test configuration that includes a waveform;

parameterizing a first portion of the waveform with a set of frequency domain parameters based on a first amount of information required to parameterize the first portion of the waveform with the set of frequency domain parameters and a second amount of information required to digitize the first portion of the waveform with a set of samples of the first portion of the waveform, wherein the first amount of information is less than the second amount of information;

digitizing a second portion of the waveform with a set of samples of the second portion of the waveform based on a third amount of information required to parameterize the second portion of the waveform with another set of frequency domain parameters and a fourth amount of information required to digitize the second portion of the waveform with the set of samples of the second portion of the waveform, wherein the third amount of information is greater than the fourth amount of information;

encoding the waveform, wherein the first portion of the waveform is encoded with the set of frequency domain parameters and the second portion of the waveform is encoded with the set of samples of the second portion of the waveform;

generating test instructions based on the received test configuration, wherein the test instructions include the set of frequency domain parameters and the set of samples of the second portion of the waveform;

providing the test instructions to the RTU via the communication network and the first communication module of the RTU;

employing the one or more logic devices of the RTU to execute the test instructions, wherein executing the test instructions includes generating the first portion of the waveform based on the set of frequency parameters, generating the second portion of the waveform based on the set of samples of the second portion of the waveform, and employing the second communication module of the RTU, which is communicatively coupled to the DUT, to provide the generated first and second portions of the waveform to the DUT;

in response to executing the test instructions, employing the second communication module of the RTU to receive one or more incoming test signals that are generated by the DUT in response to receiving the provided first and second portions of the waveform;

employing the one or more logic devices of the RTU to generate test data based on the one or more incoming test signals;

receiving the test data from the RTU via the first communication module of the RTU and the communication network; and generating a test report based on the test data; and displaying, on the display device, at least one visualization of the test data.

16. The system of claim 15, wherein the actions further include:

in response to executing the test instructions, employing a signal generation and detection (SGD) module of the RTU to generate one or more outgoing test signals;

employing the second communication module of the RTU to provide the one or more outgoing test signals to the DUT, wherein the one or more outgoing test signals includes the first and second portions of the waveform;

employing the second communication module of the RTU to receive one or more incoming test signals generated by the DUT, wherein the one or more incoming test signals are in response to the provided one or more outgoing test signals; and employing the one or more logic devices of the RTU to generate the test data, wherein the test data encodes each of the one or more outgoing test signals and the one or more incoming test signals.

17. The system of claim 16, wherein the actions further include:

employing one or more signal conditioning components of the SGD module to condition the one or more outgoing test signals;

employing the second communication module of the RTU to provide the one or more conditioned outgoing test signals to the DUT; and employing the one or more signal conditioning components of the SGD module to condition the one or more incoming test signals.

18. The system of claim 15, wherein the actions further include:

employing the one or more logic devices of the RTU to generate one or more signal parameters based on a first portion of the one or more incoming test signals, wherein the one or more signal parameters includes a second set of frequency domain parameters;

employing one or more signal conversion components of the RTU to generate a second set of waveform samples based on sampling a second portion of the one or more incoming test signals; and employing the one or more logic devices of the RTU to generate the test data, wherein the test data include the one or more signal parameters and the second set of waveform samples.

19. The system of claim 15, wherein the first communication module of the RTU employs an internet protocol suite to provide the test data to the user-computing device and the second communication module of the RTU includes one or more components that convert the incoming test signals between a serial encoding and a parallel encoding.

20. The system of claim 15, wherein the actions further include:

enabling a user to employ the user-computing device to manually draw the waveform.

\* \* \* \* \*